United States Patent
Fujimoto et al.

(10) Patent No.: US 7,145,177 B2
(45) Date of Patent: Dec. 5, 2006

(54) LIGHT EMITTING DEVICE

(75) Inventors: Etsuko Fujimoto, Atsugi (JP); Satoshi Murakami, Atsugi (JP); Kazutaka Inukai, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 265 days.

(21) Appl. No.: 10/752,815

(22) Filed: Jan. 8, 2004

(65) Prior Publication Data

US 2004/0140472 A1 Jul. 22, 2004

Related U.S. Application Data

(62) Division of application No. 09/915,539, filed on Jul. 27, 2001, now Pat. No. 6,690,034.

(30) Foreign Application Priority Data

Jul. 31, 2000 (JP) ............................. 2000-232431

(51) Int. Cl.
 *H01L 27/15* (2006.01)
(52) U.S. Cl. ........................ 257/79; 258/84; 258/350
(58) Field of Classification Search ................. 257/79, 257/84, 98, 350; 438/151, 163
See application file for complete search history.

(56) References Cited

U.S. PATENT DOCUMENTS

| | | | |
|---|---|---|---|
| 4,394,182 A | 7/1983 | Maddox, III | |
| 5,247,190 A | 9/1993 | Friend et al. | |
| 5,399,502 A | 3/1995 | Friend et al. | |
| 5,532,176 A | 7/1996 | Katada et al. | |
| 5,583,369 A | 12/1996 | Yamazaki et al. | |
| 5,736,750 A | 4/1998 | Yamazaki et al. | |
| 5,830,787 A | 11/1998 | Kim | |
| 6,246,180 B1 | 6/2001 | Nishigaki | |
| 6,362,798 B1 | 3/2002 | Kimura et al. | |
| 6,596,571 B1 * | 7/2003 | Arao et al. | 438/163 |
| 6,664,145 B1 * | 12/2003 | Yamazaki et al. | 438/149 |
| 2001/0009283 A1 | 7/2001 | Arao et al. | |
| 2001/0017372 A1 | 8/2001 | Koyama | |
| 2001/0035849 A1 | 11/2001 | Kimura et al. | |
| 2001/0048110 A1 | 12/2001 | Hiroki | |
| 2002/0000576 A1 * | 1/2002 | Inukai | 257/202 |
| 2002/0011597 A1 | 1/2002 | Fujimoto et al. | |
| 2002/0028544 A1 | 3/2002 | Fujimoto et al. | |

(Continued)

FOREIGN PATENT DOCUMENTS

EP 1 003 150 5/2000

(Continued)

OTHER PUBLICATIONS

Schenk et al., "Polymers for Light-Emitting Diodes," Euro Display Proceedings 1999, pp. 33-37.

(Continued)

*Primary Examiner*—Tuan H. Nguyen
(74) *Attorney, Agent, or Firm*—Eric J. Robinson; Robinson Intelletual Property Law Office, P.C.

(57) ABSTRACT

There is provided a light emitting device including a TFT having a high driving capacity (on current) and high reliability in a driver circuit and a TFT in which an off current is reduced in a pixel portion. In manufacturing the TFTs, after the TFT having an LDD region is formed, a part of a gate electrode is etched to form the TFT having a GOLD region. Thus, the TFTs having required functions can be easily formed in the driver circuit and the pixel portion, respectively, on the same substrate.

58 Claims, 11 Drawing Sheets

U.S. PATENT DOCUMENTS

| | | |
|---|---|---|
| 2002/0047120 A1 | 4/2002 | Inukai |
| 2002/0047555 A1 | 4/2002 | Inukai |
| 2002/0142554 A1 | 10/2002 | Nakajima |

FOREIGN PATENT DOCUMENTS

| | | |
|---|---|---|
| EP | 1 103 946 | 5/2001 |
| EP | 1 107 220 | 6/2001 |
| EP | 1 111 574 | 6/2001 |
| EP | 1 150 273 | 10/2001 |
| EP | 1 178 462 | 2/2002 |
| JP | 10-092576 | 4/1998 |
| JP | 10-189252 | 7/1998 |
| WO | WO 9013148 | 11/1990 |

OTHER PUBLICATIONS

Specification, claims, abstract of U.S. Appl. No. 09/724,387 filed Nov. 28, 2000 to Inukai et al.

* cited by examiner

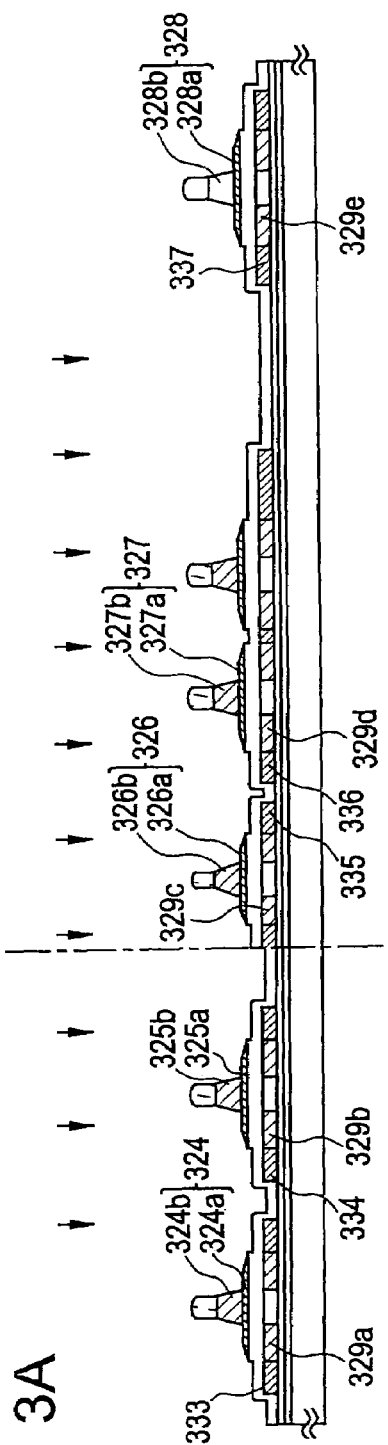
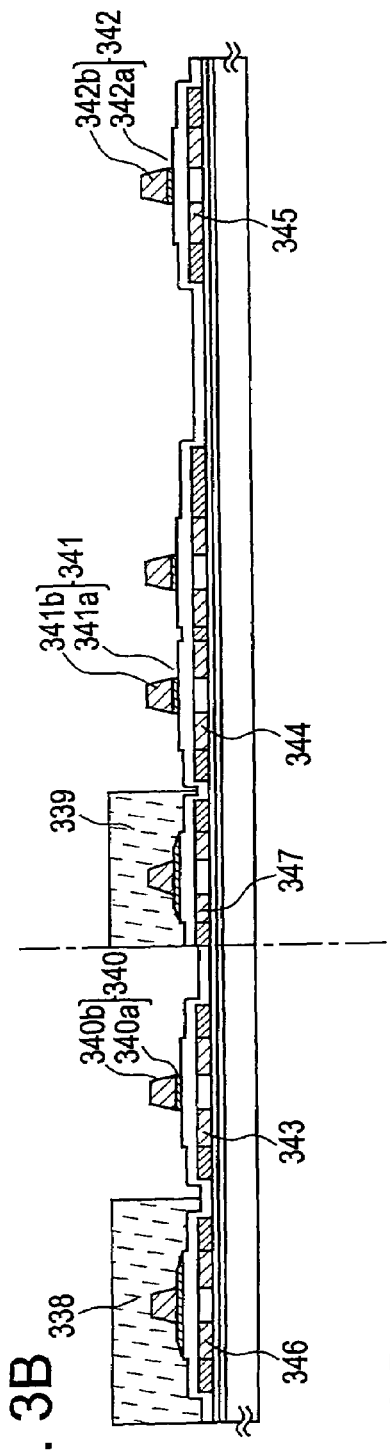
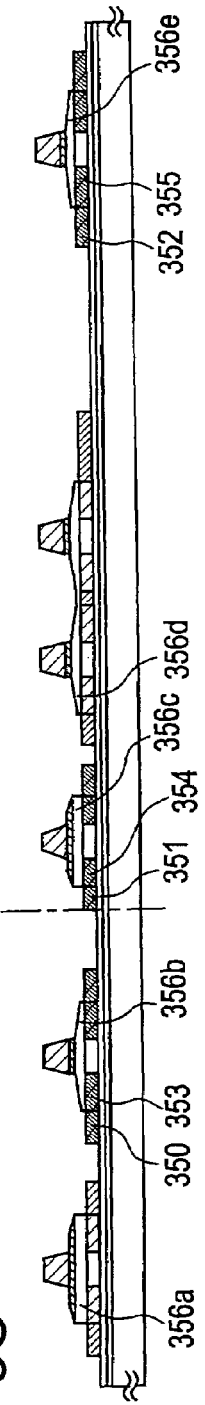
FIG. 3A
FIG. 3B
FIG. 3C

LIGHT EMITTING DEVICE

BACKGROUND OF THE INVENTION

1. Field of the Invention

The present invention relates to a light emitting device having a circuit constituted of thin film transistors (hereinafter referred to as TFTs) and a method of manufacturing the same. Note that the light emitting device in this specification refers to a device such as an image display device having a light emitting element in which light emission is obtained by applying an electric field. Further, a module in which a light emitting element is attached with a connector, for example, an anisotropic conductive film ((FPC: flexible printed circuit) or a TAB (tape automated bonding) tape, or a TCP (tape carrier package), a module in which a printed wiring board is provided at an end of a TAB tape or TCP, and a module in which an IC (integrated circuit) is directly mounted on a light emitting element by a COG (chip on glass) method are all included in the light emitting devices. In addition, electric equipment, which is mounted with the light emitting device as a part, are also included.

2. Description of the Related Art

In recent years, a technique for forming a TFT on a substrate has been greatly progressed, and application and development to an active matrix display device has been progressed. Especially, since a TFT using a polysilicon film has an electric field effect mobility (also called mobility) higher than that of a TFT using a conventional amorphous silicon film, a high speed operation is possible. Thus, control of a pixel, which is conventionally performed by a driver circuit outside a substrate, can be performed by a driver circuit formed on the same substrate as the pixel.

In such an active matrix display device, various merits such as reduction of manufacturing cost, miniaturization of an electro-optical device, improvement of a yield, and reduction of a throughput can be obtained by forming various circuits and elements on the same substrate.

Further, research of an active matrix light emitting device including an EL element as a self light emitting element has been actively carried out.

Note that, an EL element in this specification has a structure in which an EL layer is sandwiched between a pair of electrodes (anode and cathode), and the EL layer generally has a lamination structure. Typically, there is cited a lamination structure called "hole transporting layer/light emitting layer/electron transporting layer" proposed by Tang et al. of Eastman Kodak Company. This structure has a very high luminous efficiency, and most of the light emitting devices on which research and development have been made at present adopt this structure.

In addition, a lamination structure in which hole injecting layer/hole transporting layer/light emitting layer/electron transporting layer or hole injecting layer/hole transporting layer/light emitting layer/electron transporting layer/electron injecting layer are laminated in the order on an anode may be taken. The light emitting layer may be doped with a fluorescent pigment or the like.

In this specification, all the layers provided between a cathode and an anode are generically called EL layers. Thus, the hole injecting layer, hole transporting layer, light emitting layer, electron transporting layer, and electron injecting layer described above are all included in the EL layers.

Then, the EL layer with the above structure is applied with a predetermined voltage from a pair of electrodes, whereby recombination of carriers is generated in the light emitting layer to obtain light emission. Note that the light emission obtained here includes fluorescence and phosphorescence. Further, a light emitting element composed of an anode, an EL layer and a cathode is referred to the EL element in this specification.

Deterioration of the EL layer of the EL element is promoted by heat, light, moisture, oxygen or the like. Thus, the EL element is generally formed after the formation of wirings and TFTs in a pixel portion in manufacturing the active matrix light emitting device.

In the active matrix light emitting device, a switching element formed of a TFT is provided in each pixel, and a driving element for controlling current (current control TFT) is operated by the switching element (switching TFT) to thereby make the EL layer (light emitting layer) emit light. For example, there is a light emitting device described in Japanese Patent Application Laid-open No. Hei 10-189252.

Note that the switching TFT and the current control TFT in the pixel portion require a low off current (Ioff). A structure having a region (LDD region) where a gate electrode does not overlap a low concentration impurity region through a gate insulating film is known as a TFT structure for reducing an off current.

On the contrary, an image circuit for displaying an image and a driver circuit for controlling the image circuit are required to have a high driving capacity (on current: Ion) and prevent deterioration due to a hot carrier effect to thereby improve reliability. A structure having a region (GOLD region) where a gate electrode overlaps a low concentration impurity region through a gate insulating film is known as a structure effective in preventing deterioration of an on current value due to hot carriers.

SUMMARY OF THE INVENTION

However, a manufacturing process of the TFT having the LDD region and the TFT having the GOLD region is complicated. Thus, an object of the present invention is, in an active matrix light emitting device, to make a TFT used in a driver circuit have a high driving capacity (on current) and reliability while to make a TFT used in a pixel portion have a low off current, and to realize the manufacturing process with a small number of masks.

In the present invention, among TFTs formed on the same substrate, an n-channel TFT used in a driver circuit is formed with a structure having a low concentration impurity region (GOLD region) at the position that overlaps a gate electrode made of a conductive layer. On the other hand, an n-channel TFT used in a pixel portion is formed with a structure having a low concentration impurity region (LDD region) at the position that does not overlap a gate electrode.

The TFT having the GOLD region has a structure that is suitable for preventing deterioration due to hot carrier injection in the TFT and that is suitable for the driver circuit because of the high on current.

Further, the TFT having the LDD region has a structure in which an off current becomes low, which means a structure suitable for the TFT in the pixel portion.

Moreover, a p-channel TFT is manufactured by doping an impurity element into an impurity region of the n-channel TFT. Note that, if doping is conducted using the n-channel TFT having the LDD region at this time, variation of an impurity concentration in accordance with a thickness of a gate electrode, which occurs in doping the impurity element into the n-channel TFT having the GOLD region, can be suppressed.

Thus, the light emitting device provided with the TFTs suitable for the driver circuit and the pixel portion can be manufactured by forming the TFTs with the above structure on the same substrate.

BRIEF DESCRIPTION OF THE DRAWINGS

In the accompanying drawings:

FIGS. 3A to 3C show the manufacturing process of the light emitting device of the present invention;

DETAILED DESCRIPTION OF THE PREFERRED EMBODIMENTS

Embodiment Mode

Figure 1A:
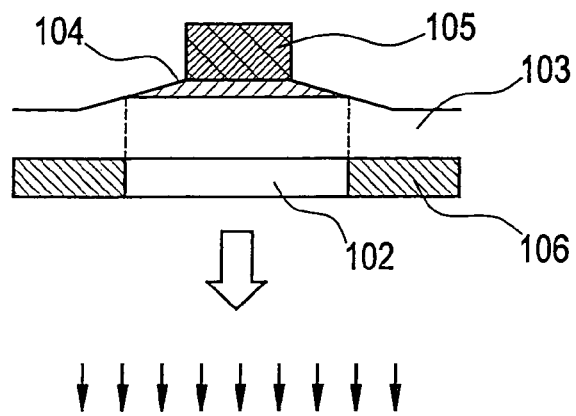
FIGS. 1A to 1F are diagrams for explaining an embodiment mode of the present invention.

An embodiment mode of the present invention is described in detail with reference to FIGS. 1A to 1F. In FIG. 1A, reference numeral 102 indicates a semiconductor layer made from Si, and a gate electrode made of a conductive layer is formed on a part of the semiconductor layer. Note that the gate electrode has a lamination structure of a gate electrode 1 (104) made of TaN and a gate electrode 2 (105) made of W here, and impurities (phosphorous) are doped through a gate insulating film 103 made of an insulating film containing silicon with the gate electrode as a mask to form a high concentration impurity region 106. Note that the high concentration impurity region 106 finally becomes a source region or a drain region of an n-channel TFT.

Figure 1B:
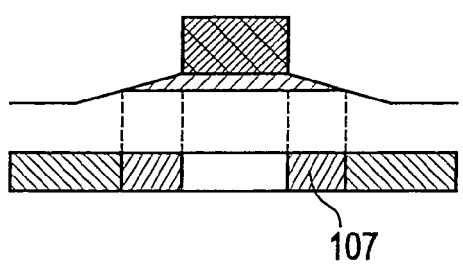

Then, impurities (phosphorous) are doped again to form a low concentration impurity region a (107). Incidentally, an impurity concentration of the low concentration impurity region a (107) is set to be lower than that of the above high concentration impurity region (FIG. 1B). Note that such a low concentration impurity region is referred to as an LDD (lightly doped drain) region. Note also that the low concentration impurity region a (107) formed here overlaps the gate electrode through the gate insulating film, and thus, is referred to as a GOLD (gate-drain overlapped LDD) region.

Next, an etching process is conducted. A TFT with the etched gate electrode 1 (104) at this time has the structure shown in FIG. 1C. Specifically, the gate electrode 1 (104) is etched, whereby the impurity region a (107) formed at the position that overlaps the gate electrode 1 (104) in FIG. 1B becomes a low concentration impurity region b (108) that does not overlap the gate electrode 1 (104).

Figure 1C:
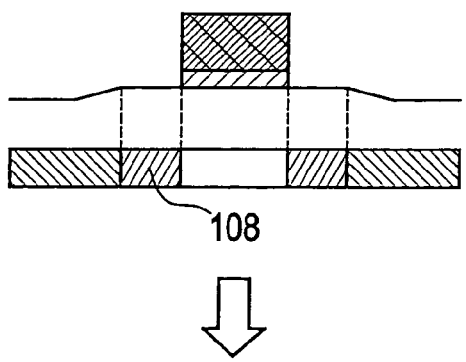
Figure 1D:
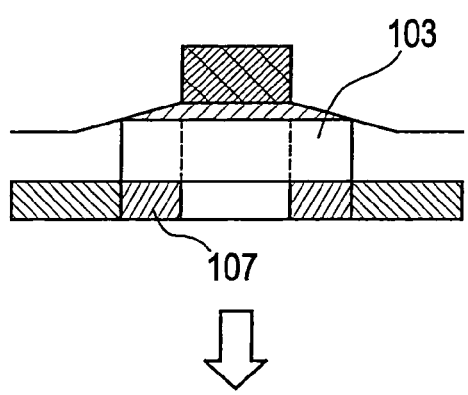

On the contrary, in the case where a mask has been formed such that the gate electrode 1 (104) is not etched, the structure of FIG. 1D having the low concentration impurity region a (107) can be formed.

Then, the gate insulating film 103 is entirely etched. Thus, the impurity region 106 is exposed as shown in FIG. 1E and FIG. 1F, and n-channel TFTs having different structures can be formed on the same substrate.

Note that, since the n-channel TFT with the structure shown in FIG. 1C has a region (LDD region) where the low concentration impurity region does not overlap the gate electrode, the off current can be lowered. Thus, the n-channel TFT is used in a pixel portion. Further, the n-channel TFT with the structure shown in FIG. 1D has a structure (GOLD region) in which the low concentration impurity region overlaps the gate electrode, and thus, the on current can be raised and also the deterioration due to hot carriers can be prevented. Therefore, the n-channel TFT is used in a driver circuit.

Figure 1E:
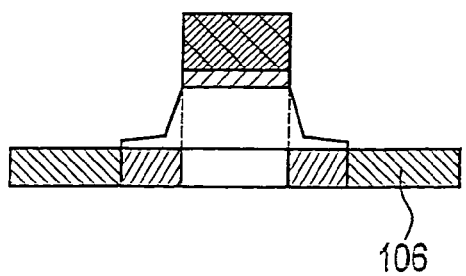
Figure 1F:
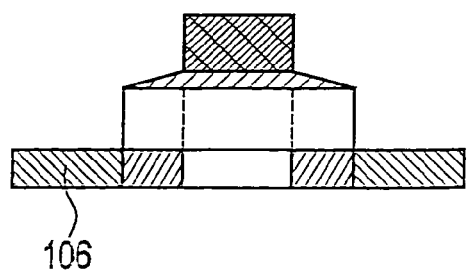

Further, the n-channel TFT with the structure shown in FIG. 1E is doped with impurities (boron) to form a p-channel TFT. At this time, with the structure of FIG. 1E, the impurities (boron) are doped through the gate insulating film 103 on Si. Thus, variation of doping amount of impurities in accordance with the film thickness of TaN forming the gate electrode 1 (104), which occurs in doping the impurities (boron) into the n-channel TFT with the structure shown in FIG. 1F, can be prevented. That is, the p-channel TFT with a uniform impurity concentration in the impurity region can be manufactured.

Note that the p-channel TFT manufactured here is used in the driver circuit and the pixel portion. However, the p-channel TFT in the driver circuit is not limited to this. The p-channel TFT manufactured by doping the impurities (boron) into the n-channel TFT with the structure shown in FIG. 1F may be used.

Hereinafter, embodiments of the present invention are described. Note that the following are the preferred embodiments, and the light emitting device of the present invention is not limited to the embodiments below.

EMBODIMENTS

Embodiment 1

Here, a method of simultaneously manufacturing TFTs (n-channel TFT and p-channel TFT) in a pixel portion and a driver circuit provided in the periphery of the pixel portion on the same substrate by implementing the present invention is described in detail with reference to FIG. 2A to FIG. 5.

First, in this embodiment, a substrate 300 is used, which is made of glass such as barium borosilicate glass or alumino borosilicate glass, typified by #7059 glass or #1737 glass of Corning Inc. There is no limitation on the substrate 300 as long as a substrate having a light transmitting property is used, and a quartz substrate may also be used. In addition, a plastic substrate having heat resistance to a treatment temperature of this embodiment may also be used.

Then, a base film 301 formed of an insulating film such as a silicon oxide film, a silicon nitride film or a silicon oxide nitride film is formed on the substrate 300. In this embodiment, a two-layer structure is used for the base film 301. However, a single layer film or a lamination structure consisting of two or more layers of the insulating film may also be used. As a first layer of the base film 301, a silicon oxide nitride film 301a is formed with a thickness of 10 to 200 nm (preferably 50 to 100 nm) using SiH$_4$, NH$_3$, and N$_2$O as reaction gases by a plasma CVD method. In this embodiment, the silicon oxide nitride film 301a (composition ratio Si=32%, O=27%, N=24% and H=17%) having a film thickness of 50 nm is formed. Then, as a second layer of the base film 301, a silicon oxide nitride film 301b is formed so as to be laminated on the first layer with a thickness of 50 to 200 nm (preferably 100 to 150 nm) using SiH$_4$ and N$_2$O as reaction gases by the plasma CVD method. In this embodiment, the silicon oxide nitride film 301b (composition ratio Si=32%, O=59%, N=7% and H=2%) having a film thickness of 100 nm is formed.

Subsequently, semiconductor layers 302 to 305 are formed on the base film. The semiconductor layers 302 to 305 are formed such that a semiconductor film having an amorphous structure is formed by a known method (a sputtering method, an LPCVD method, a plasma CVD method or the like), and is subjected to a known crystallization process (a laser crystallization method, a thermal crystallization method, a thermal crystallization method using a catalyst such as nickel, or the like) to obtain a crystalline semiconductor film, and the crystalline semiconductor film is patterned into desired shapes. The semiconductor layers 302 to 305 are formed with a thickness of 25 to 80 nm (preferably 30 to 60 nm). The material of the crystalline semiconductor film is not particularly limited, but it is preferable to form the film using silicon, a silicon germanium (Si$_x$Ge$_{1-x}$(X=0.0001 to 0.02)) alloy, or the like. In this embodiment, an amorphous silicon film of 55 nm thickness is formed by a plasma CVD method, and then, a nickel-containing solution is held on the amorphous silicon film. A dehydrogenation process of the amorphous silicon film is performed (at 500° C. for 1 hour), and thereafter a thermal crystallization process is performed (at 550° C. for 4 hours) thereto. Further, to improve the crystallinity, a laser annealing process is performed to form the crystalline silicon film. Then, this crystalline silicon film is subjected to a patterning process using a photolithography method to obtain the semiconductor layers 302 to 305.

Further, after the formation of the semiconductor layers 302 to 305, a minute amount of impurity element (boron or phosphorus) may be doped to control a threshold value of the TFT.

Besides, in the case where the crystalline semiconductor film is manufactured by the laser crystallization method, a pulse oscillation type or continuous emission type excimer laser, YAG laser, or YVO$_4$ laser may be used. In the case where those lasers are used, it is appropriate to use a method in which laser light radiated from a laser oscillator is condensed into a linear shape by an optical system, and is irradiated to the semiconductor film. Although the conditions of crystallization should be properly selected by an operator, in the case where the excimer laser is used, a pulse oscillation frequency is set to 300 Hz, and a laser energy density is set to 100 to 400 mJ/cm$^2$ (typically 200 to 300 mJ/cm$^2$). In the case where the YAG laser is used, it is appropriate to set a pulse oscillation frequency as 30 to 300 Hz using the second harmonic, and to set a laser energy density to 300 to 600 mJ/cm$^2$ (typically, 350 to 500 mJ/cm$^2$). Then, laser light condensed into a linear shape with a width of 100 to 1000 μm, for example, 400 μm, is irradiated to the whole surface of the substrate, and an overlapping ratio (overlap ratio) of the linear laser light at this time may be set to 50 to 90%.

A gate insulating film 306 is then formed for covering the semiconductor layers 302 to 305. The gate insulating film 306 is formed of an insulating film containing silicon with a thickness of 40 to 150 nm by a plasma CVD or sputtering method. In this embodiment, the gate insulating film 306 is formed of a silicon oxide nitride film with a thickness of 110 nm by the plasma CVD method (composition ratio Si=32%, O=59%, N=7%, and H=2%). Of course, the gate insulating film is not limited to the silicon oxide nitride film, and other insulating films containing silicon may be used with a single layer or a lamination structure.

Besides, when a silicon oxide film is used, it can be formed such that TEOS (tetraethyl orthosilicate) and O$_2$ are mixed by the plasma CVD method with a reaction pressure of 40 Pa and a substrate temperature of 300 to 400° C., and discharged at a high frequency (13.56 MHz) power density of 0.5 to 0.8 W/cm$^2$. The silicon oxide film thus manufactured can obtain satisfactory characteristics as the gate insulating film by subsequent thermal annealing at 400 to 500° C.

Figures 2A, 2B, 2C:
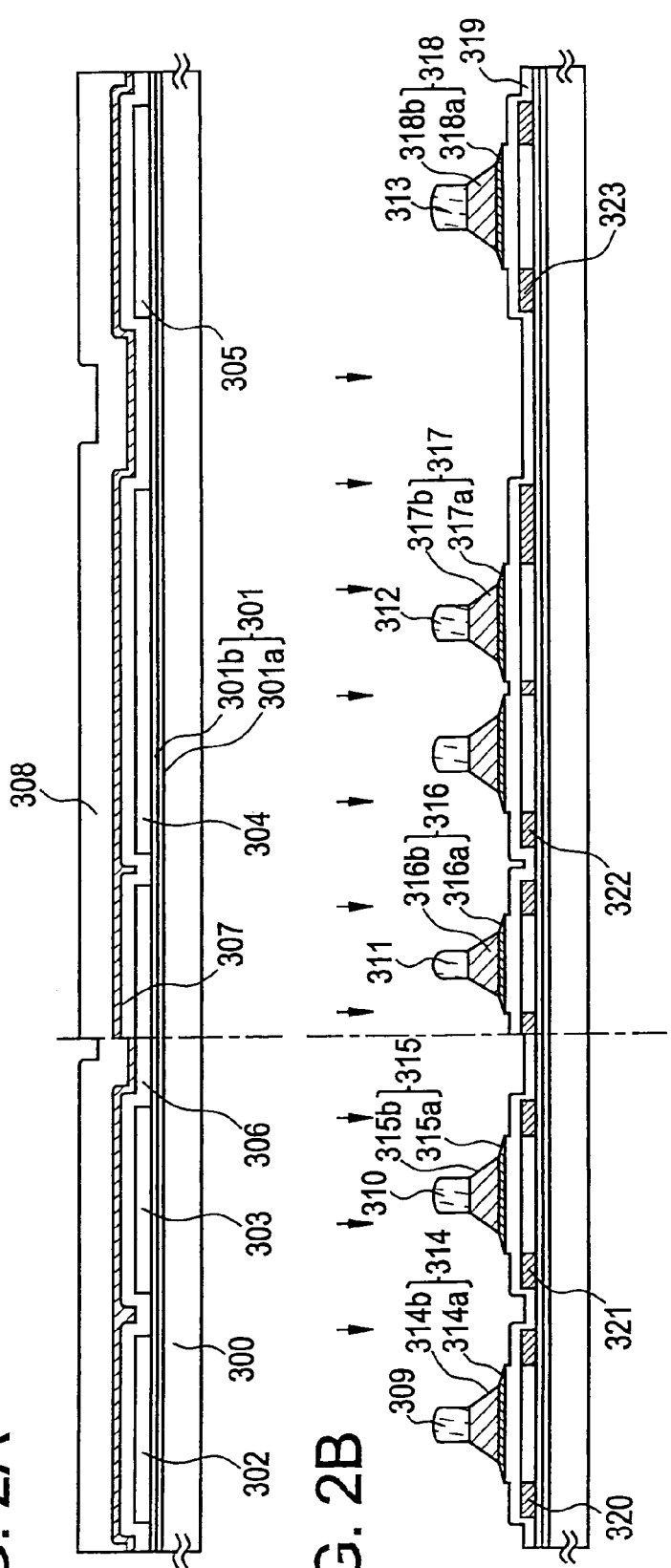
FIGS. 2A to 2C show a manufacturing process of a light emitting device of the present invention.

Then, as shown in FIG. 2A, a first conductive film 307 of 20 to 100 nm thickness and a second conductive film 308 of 100 to 400 nm thickness are formed into lamination on the gate insulating film 306. In this embodiment, the first conductive film 307 made of a TaN film with a thickness of 30 nm and the second conductive film 308 made of a W film with a thickness of 370 nm are formed into lamination. The TaN film is formed by sputtering with a Ta target under a nitrogen containing atmosphere. Besides, the W film is formed by sputtering with a W target. The W film may also be formed by a thermal CVD method using tungsten hexafluoride (WF$_6$). Whichever method is used, it is necessary to make the material have low resistance for use as a gate electrode, and it is preferred that the resistivity of the W film is set to 20 μΩcm or less. It is possible to make the W film have low resistance by making the crystal grains large. However, in the case where many impurity elements such as oxygen are contained within the W film, crystallization is inhibited and the resistance becomes higher. Therefore, in this embodiment, the W film is formed by sputtering using a W target having a high purity of 99.9999%, and also by taking sufficient consideration so as to prevent impurities within the gas phase from mixing therein during the film formation, and thus, a resistivity of 9 to 20 μΩcm can be realized.

Note that, in this embodiment, the first conductive film 307 is made of TaN, and the second conductive film 308 is made of W, but the material is not particularly limited thereto, and either film may be formed from an element selected from the group consisting of Ta, W, Ti, Mo, Al, Cu, Cr, and Nd or an alloy material or a compound material containing the above element as its main constituent. Besides, a semiconductor film typified by a polycrystalline silicon film doped with an impurity element such as phosphorus may be used. An alloy made of Ag, Pd, and Cu may also be used. Further, any combination may be employed such as a combination in which the first conductive film is formed of a tantalum (Ta) film and the second conductive film is formed of a W film, a combination in which the first conductive film is formed of a titanium nitride (TiN) film and the second conductive film is formed of a W film, a combination in which the first conductive film is formed of a tantalum nitride (TaN) film and the second conductive film is formed of an Al film, or a combination in which the first conductive film is formed of a tantalum nitride (TaN) film and the second conductive film is formed of a Cu film.

Next, as shown in FIG. 2B, masks 309 to 313 made of resist are formed by using a photolithography method, and a first etching process for forming electrodes and wirings is carried out. In the first etching process, first and second etching conditions are used. In this embodiment, as the first etching condition, an ICP (inductively coupled plasma) etching method is used, in which $CF_4$, $Cl_2$, and $O_2$ are used as etching gases, a gas flow rate is set to 25/25/10 sccm, and an RF (13.56 MHz) power of 500 W is applied to a coil shape electrode under a pressure of 1 Pa to generate plasma. Thus, the etching is performed. A dry etching device using ICP (Model E645-ICP) manufactured by Matsushita Electric Industrial Co. is used here. A 150 W RF (13.56 MHz) power is also applied to the substrate side (sample stage), thereby substantially applying a negative self-bias voltage. The W film is etched under the first etching condition, and the end portion of the first conductive layer is formed into a tapered shape. In the first etching condition, the etching rate for W is 200.39 nm/min, the etching rate for TaN is 80.32 nm/min, and the selectivity of W to TaN is about 2.5. Further, the taper angle of W is about 26° under the first etching condition.

Thereafter, as shown in FIG. 2B, the etching condition is changed into the second etching condition without removing the masks 309 to 313 made of resist, and the etching is performed for about 30 seconds, in which $CF_4$ and $Cl_2$ are used as the etching gases, a gas flow rate is set to 30/30 sccm, and an RF (13.56 MHz) power of 500 W is applied to a coil shape electrode under a pressure of 1 Pa to generate plasma. An RF (13.56 MHz) power of 20 W is also applied to the substrate side (sample stage), and a substantially negative self-bias voltage is applied thereto. In the second etching condition in which $CF_4$ and $Cl_2$ are mixed, the W film and the TaN film are etched to the same degree. In the second etching condition, the etching rate for W is 58.97 nm/min, and the etching rate for TaN is 66.43 nm/min. Note that, in order to perform the etching without leaving any residue on the gate insulating film, it is appropriate that an etching time is increased by approximately 10 to 20%.

In the above first etching process, by making the shapes of the masks formed of resist suitable, end portions of the first conductive layer and the second conductive layer become tapered shape by the effect of the bias voltage applied to the substrate side. The angle of the taper portion may be 15 to 45°. In this way, first shape conductive layers 314 to 318 consisting of the first conductive layer and the second conductive layer (first conductive layers 314a to 318a and second conductive layers 314b to 318b) are formed by the first etching process. Reference numeral 319 indicates a gate insulating film, and the regions not covered with the first shape conductive layers 314 to 318 are made thinner by approximately 20 to 50 nm by etching.

Then, a first doping process is performed to add an impurity element imparting n-type conductivity to the semiconductor layer without removing the masks made of resist (FIG. 2B). Doping may be carried out by an ion doping method or an ion injecting method. The condition of the ion doping method is that a dosage is $1 \times 10^{13}$ to $5 \times 10^{15}$ atoms/$cm^2$, and an acceleration voltage is 60 to 100 keV. In this embodiment, the dosage is $1.5 \times 10^{15}$ atoms/$cm^2$ and the acceleration voltage is 80 keV. As the impurity element imparting n-type conductivity, an element belonging to group 15 of the periodic table, typically phosphorus (P) or arsenic (As) is used, but phosphorus (P) is used here. In this case, the conductive layers 314 to 318 become masks for the impurity element imparting n-type conductivity, and high concentration impurity regions 320 to 323 are formed in a self-aligning manner. The impurity element imparting n-type conductivity in a concentration range of $1 \times 10^{20}$ to $1 \times 10^{21}$ atoms/$cm^3$ is added to the high concentration impurity regions 320 to 323.

Thereafter, as shown in FIG. 2C, a second etching process is performed without removing the masks made of resist. Here, a gas mixture of $CF_4$, $Cl_2$ and $O_2$ is used as an etching gas, the gas flow rate is set to 20/20/20 sccm, and a 500 W RF (13.56 MHz) power is applied to a coil shape electrode under a pressure of 1 Pa to generate plasma, thereby performing etching. A 20 W RF (13.56 MHz) power is also applied to the substrate side (sample stage), thereby substantially applying a negative self-bias voltage. In the second etching process, the etching rate for W is 124.62 nm/min, the etching rate for TaN is 20.67 nm/min, and the selectivity of W to TaN is 6.05. Accordingly, the W film is selectively etched. The taper angle of W is 70° by the second etching process. Second conductive layers 324b to 328b are formed by the second etching process. On the other hand, the first conductive layers 314a to 318a are hardly etched, and first conductive layers 324a to 328a are formed.

Next, a second doping process is performed. The second conductive layers 324b to 328b are used as masks for an impurity element, and doping is performed such that the impurity element is added to the semiconductor layer below the tapered portions of the first conductive layers. In this embodiment, phosphorus (P) is used as the impurity element, and plasma doping is performed with a dosage of $1.5 \times 10^{14}$ atoms/$cm^2$, a current density of 0.5 µA, and an acceleration voltage of 90 keV. Thus, low concentration impurity regions 329a to 329e, which overlap with the first conductive layers, are formed in self-aligning manner. The concentration of phosphorus (P) added to the low concentration impurity regions 329a to 329e is $1 \times 10^{17}$ to $5 \times 10^{18}$ atoms/$cm^3$, and has a gentle concentration gradient in accordance with the film thickness of the tapered portions of the first conductive layers. Note that in the semiconductor layers that overlap with the tapered portions of the first conductive layers, the concentration of the impurity element slightly falls from the end portions of the tapered portions of the first conductive layers toward the inner portions, but the concentration keeps almost the same level. Further, an impurity element is added to the high concentration impurity regions 320 to 323 to form high concentration impurity regions 333 to 337.

Thereafter, as shown in FIG. 3B, after the masks made of resist are removed, a third etching process is performed using a photolithography method. The tapered portions of the first conductive layers are partially etched so as to have shapes overlapping the second conductive layers in the third etching process. Incidentally, as shown in FIG. 3B, masks 338 and 339 made of resist are formed in the regions where the third etching process is not conducted.

The etching condition in the third etching process is that $Cl_2$ and $SF_6$ are used as etching gases, the gas flow rate is set to 10/50 sccm, and the ICP etching method is used as in the first and second etching processes. Note that, in the third etching process, the etching rate for TaN is 111.2 nm/min, and the etching rate for the gate insulating film is 12.8 nm/min.

In this embodiment, a 500 W RF (13.56 MHz) power is applied to a coil shape electrode under a pressure of 1.3 Pa to generate plasma, thereby performing etching. A 10 W RF (13.56 MHz) power is also applied to the substrate side (sample stage), thereby substantially applying a negative self-bias voltage. Thus, first conductive layers 340a to 342a are formed.

Impurity regions (LDD regions) 343 to 345, which do not overlap the first conductive layers 340a to 342a, are formed by the third etching process. Note that impurity regions (GOLD regions) 346 and 347 remains overlapping the first conductive layers 324a and 326a.

Further, the electrode constituted of the first conductive layer 324a and the second conductive layer 324b finally becomes the gate electrode of the n-channel TFT of the driver circuit, and the electrode constituted of the first conductive layer 340a and a second conductive layer 340b finally becomes the gate electrode of the p-channel TFT of the driver circuit.

Similarly, the electrode constituted of the first conductive layer 341a and a second conductive layer 341b finally becomes the gate electrode of the n-channel TFT of the pixel portion, and the electrode constituted of the first conductive layer 342a and a second conductive layer 342b finally becomes the gate electrode of the p-channel TFT of the pixel portion. Further, the electrode constituted of the first conductive layer 326a and the second conductive layer 326b finally becomes one of electrodes of a capacitor (storage capacitor) of the pixel portion.

In this way, in this embodiment, the impurity regions (LDD regions) 343 to 345 that do not overlap the first conductive layers 340a to 342a and the impurity regions (GOLD regions) 346 and 347 that overlap the first conductive layers 324a and 326a can be simultaneously formed. Thus, different impurity regions can be formed in accordance with the TFT characteristics.

Next, as shown in FIG. 3C, the gate insulating film 319 is subjected to an etching process. In this etching process, $CHF_3$ is used as an etching gas, and a reactive ion etching method (RIE method) is used. In this embodiment, a fourth etching process is conducted with a chamber pressure of 6.7 Pa, RF power of 800 W, and a gas flow rate of $CHF_3$ of 35 sccm. Thus, parts of the high concentration impurity regions 333 to 337 are exposed, and insulating films 356a to 356e are formed.

Figure 4A:
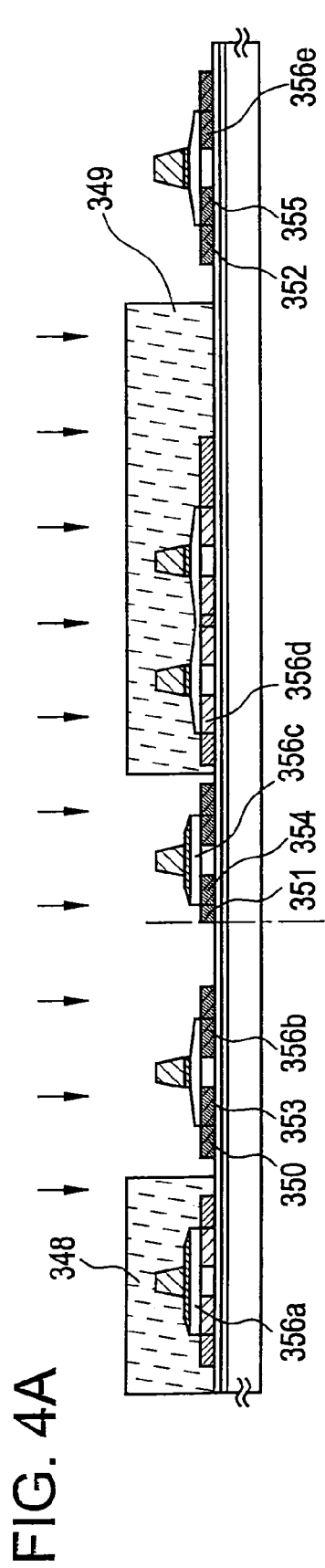
FIGS. 4A to 4C show the manufacturing process of the light emitting device of the present invention.

Subsequently, after the masks made of resist are removed, masks 348 and 349 made of resist are newly formed to thereby perform a third doping process. By this third doping process, impurity regions 350 to 355 added with an impurity element imparting conductivity (p-type) opposite to the above conductivity (n-type) are formed in the semiconductor layers that become active layers of the p-channel TFT (FIG. 4A). The first conductive layers 340a, 326a, and 342a are used as masks for the impurity element, and the impurity element imparting p-type conductivity is added to form the impurity regions in a self-aligning manner.

In this embodiment, the impurity regions 350 to 355 are formed by an ion doping method using diborane ($B_2H_6$). Note that, in the third doping process, the semiconductor layers forming the n-channel TFTs are covered with the masks 348 and 349 made of resist. The impurity regions 350 to 355 are respectively added with phosphorous at different concentrations by the first doping process and the second doping process. In any of the regions, the doping process is conducted such that the concentration of the impurity element imparting p-type conductivity becomes $2 \times 10^{20}$ to $2 \times 10^{21}$ atoms/cm$^3$. Thus, the impurity regions function as source and drain regions of the p-channel TFT, and therefore, no problem occurs.

Through the above-described processes, the impurity regions are formed in the respective semiconductor layers. Note that, in this embodiment, a method of conducting doping of the impurities (boron) after etching the gate insulating film is shown, but doping of the impurities may be conducted before etching the gate insulating film.

Figure 4B:
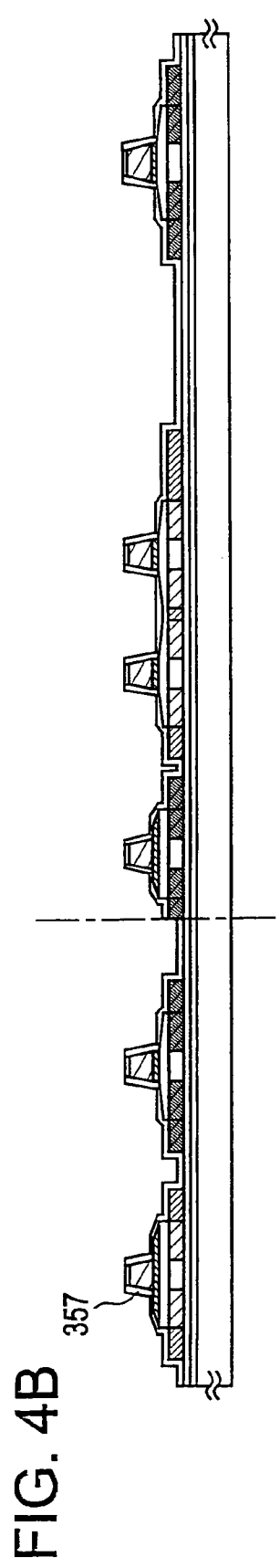

Subsequently, the masks 348 and 349 made of resist are removed, and as shown in FIG. 4B, a first interlayer insulating film 357 is formed. As the first interlayer insulating film 357, an insulating film containing silicon is formed with a thickness of 100 to 200 nm by a plasma CVD method or a sputtering method. In this embodiment, a silicon oxide nitride film of 150 nm thickness is formed by the plasma CVD method. Of course, the first interlayer insulating film 357 is not limited to the silicon oxide nitride film, and other insulating films containing silicon may be used in a single layer or a lamination structure.

Then, a process of activating the impurity element added to the semiconductor layers is performed. This activation process is performed by a thermal annealing method using an annealing furnace. The thermal annealing method may be performed in a nitrogen atmosphere with an oxygen concentration of 1 ppm or less, preferably 0.1 ppm or less and at 400 to 700° C., typically 500 to 550° C. In this embodiment, the activation process is conducted by a heat treatment for 4 hours at 550° C. Note that, in addition to the thermal annealing method, a laser annealing method or a rapid thermal annealing method (RTA method) can be applied.

Note that, in this embodiment, with the activation process, nickel used as a catalyst in crystallization is gettered to the impurity regions (334 to 337, 350 and 352) containing phosphorous at high concentration, and the nickel concentration in the semiconductor layer that becomes a channel forming region is mainly reduced. The TFT thus manufactured having the channel forming region has the lowered off current value and good crystallinity to obtain a high electric field effect mobility. Thus, the satisfactory characteristics can be attained.

Further, the activation process may be conducted before the formation of the first interlayer insulating film. Incidentally, in the case where the used wiring material is weak to heat, the activation process is preferably conducted after the formation of the interlayer insulating film (insulating film containing silicon as its main constituent, for example, silicon nitride film) in order to protect wirings and the like as in this embodiment.

Furthermore, after the activation process and the doping process, the first interlayer insulating film may be formed.

Moreover, a heat treatment is carried out at 300 to 550° C. for 1 to 12 hours in an atmosphere containing hydrogen of 3 to 100% to perform a process of hydrogenating the semiconductor layers. In this embodiment, the heat treatment is conducted at 410° C. for 1 hour in a nitrogen atmosphere containing hydrogen of approximately 3%. This is a process of terminating dangling bonds in the semiconductor layer by hydrogen included in the interlayer insulating film. As another means for hydrogenation, plasma hydrogenation (using hydrogen excited by plasma) may be performed.

In addition, in the case where the laser annealing method is used as the activation process, after the hydrogenation process, laser light emitted from an excimer laser, a YAG laser or the like is desirably irradiated.

Figure 4C:
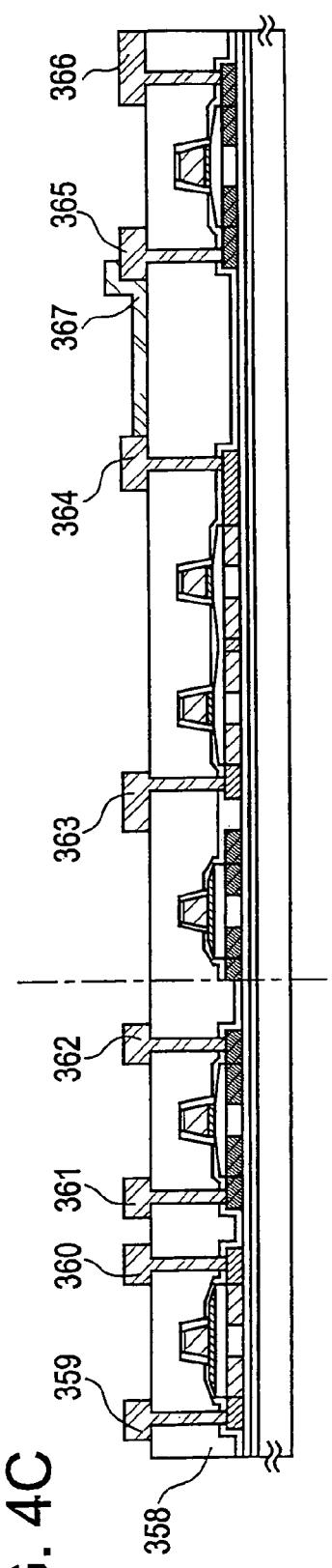

Next, as shown in FIG. 4C, a second interlayer insulating film 358, which is made from an organic insulating material, is formed on the first interlayer insulating film 357. In this embodiment, an acrylic resin film is formed with a thickness of 1.6 μm. Then, patterning for forming contact holes that reach the respective impurity regions 333, 336, 350 and 352 is conducted.

As the second interlayer insulating film 358, a film made from an insulating material containing silicon or an organic resin is used. As the insulating material containing silicon, silicon oxide, silicon nitride, or silicon oxide nitride may be used. As the organic resin, polyimide, polyamide, acrylic, BCB (benzocyclobutene), or the like may be used.

In this embodiment, the silicon oxide nitride film formed by a plasma CVD method is formed. Note that the thickness of the silicon oxide nitride film is preferably 1 to 5 µm (more preferably 2 to 4 µm). The silicon oxide nitride film has a little amount of moisture contained in the film itself, and thus, is effective in suppressing deterioration of the EL element.

Further, dry etching or wet etching may be used for the formation of the contact holes. However, taking the problem of electrostatic destruction in etching into consideration, the wet etching method is desirably used.

Moreover, in the formation of the contact holes here, the first interlayer insulating film and the second interlayer insulating film are etched at the same time. Thus, in consideration for the shape of the contact hole, it is preferable that the material with an etching speed faster than that of the material for forming the first interlayer insulating film is used for the material for forming the second interlayer insulating film.

Then, wirings 359 to 366, which are electrically connected with the impurity regions 333, 336, 350, and 352, respectively, are formed. The wirings are formed by patterning a lamination film of a Ti film of 50 nm thickness and an alloy film (alloy film of Al and Ti) of 500 nm thickness, but other conductive films may also be used.

Subsequently, a transparent conductive film is formed thereon with a thickness of 80 to 120 nm, and by patterning the transparent conductive film, a transparent electrode 367 is formed (FIG. 4C).

Note that, in this embodiment, an indium tin oxide (ITO) film or a transparent conductive film in which indium oxide is mixed with zinc oxide (ZnO) of 2 to 20% is used as the transparent electrode.

Further, the transparent electrode 367 is formed so as to contact and overlap the drain wiring 365, thereby having electrical connection with a drain region of a current control TFT.

Figure 5:
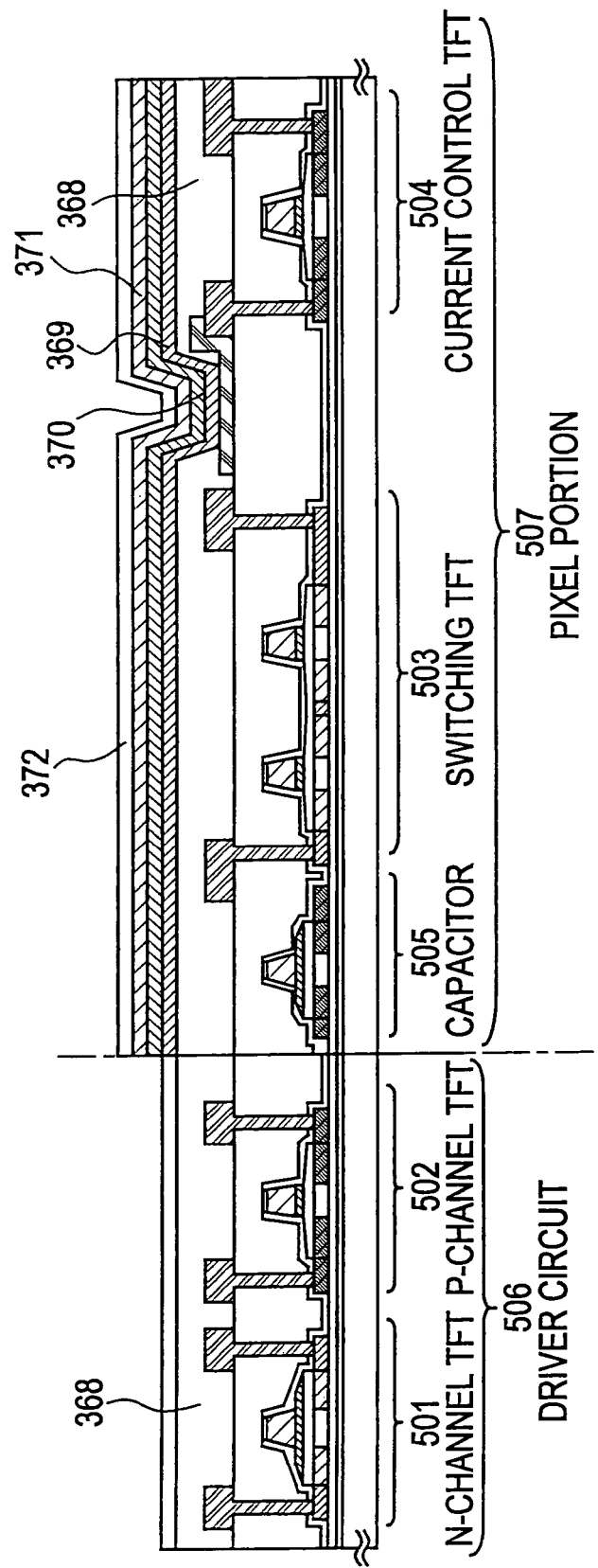
FIG. 5 shows the manufacturing process of the light emitting device of the present invention.

Next, as shown in FIG. 5, an insulating film containing silicon (a silicon oxide film in this embodiment) is formed with a thickness of 500 nm, and an opening portion is formed at the position corresponding to the transparent electrode 367 to thereby form a third interlayer insulating film 368 functioning as a bank. In forming the opening portion, side walls with a tapered shape may easily be formed by using the wet etching method. If the side walls of the opening portion are not sufficiently gentle, the deterioration of the EL layer caused by a step becomes a marked problem. Thus, attention is required.

Note that, in this embodiment, the silicon oxide film is used as the third interlayer insulating film, but depending on the situation, an organic resin film made of polyimide, polyamide, acrylic, or BCB (benzocyclobutene) may also be used.

Subsequently, an EL layer 369 is formed by an evaporation method, and further, a cathode (MgAg electrode) 370 and a protective electrode 371 are formed by the evaporation method. At this time, before the formation of the EL layer 369 and the cathode 370, it is desirable that the transparent electrode 367 is subjected to a heat treatment to completely remove moisture. Note that the MgAg electrode is used as the cathode of the EL element in this embodiment, but other known materials may also be used.

Note that a known material may be used for the EL layer 369. In this embodiment, the EL layer adopts a two-layer structure constituted of a hole transporting layer and a light emitting layer. However, there may be the case where a hole injecting layer, an electron injecting layer or an electron transporting layer is provided. Various examples of the combination have already been reported, and any structure of those may be used.

In this embodiment, polyphenylene vinylene is formed by the evaporation method as the hole transporting layer. Further, as the light emitting layer, a material in which 1, 3, 4-oxydiazole derivative PBD of 30 to 40% is distributed in polyvinyl carbazole is formed by the evaporation method, and coumarin 6 of approximately 1% is added as a center of green color light emission.

Further, the EL layer 369 can be protected from moisture or oxygen by the protective electrode 371, but a passivation film 372 is preferably formed. In this embodiment, a silicon nitride film of 300 nm thickness is provided as the passivation film 372. This passivation film may also be formed in succession after the formation of the protective electrode 371 without exposure to an atmosphere.

Moreover, the protective electrode 371 is provided to prevent deterioration of the cathode 370, and is typified by a metal film containing aluminum as its main constituent. Of course, other materials may also be used. Further, the EL layer 369 and the cathode 370 are very weak to moisture. Thus, it is preferable that continuous formation is conducted up through the formation of the protective electrode 371 without exposure to an atmosphere to protect the EL layer from the outside air.

Note that it is appropriate that the thickness of the EL layer 369 is 10 to 400 nm (typically 60 to 150 nm) and the thickness of the cathode 370 is 80 to 200 nm (typically 100 to 150 nm).

Thus, an EL module with the structure shown in FIG. 5A is completed. Note that, in a process of manufacturing an EL module in this embodiment, a source signal line is formed from Ta and W, which are materials forming the gate electrode, and a gate signal line is formed from Al that is a wiring material forming the source and drain electrodes, in connection with the circuit structure and the process. However, different materials may also be used.

Further, a driver circuit 506 having an n-channel TFT 501 and a p-channel TFT 502 and a pixel portion 507 having a switching TFT 503, a current control TFT 504, and a capacitor 505 can be formed on the same substrate.

Note that, in this embodiment, a structure in which the n-channel TFT and the p-channel TFT are used as the switching TFT 503 and the current control TFT 504, respectively, is shown since the outgoing from a lower surface is adopted in accordance with the structure of the EL element. However, this embodiment is only one preferred embodiment, and the present invention is not necessarily limited to this.

The n-channel TFT 501 of the driver circuit 506 has the channel forming region 333, the low concentration impurity region 329 (GOLD region) that overlaps the first conductive layer 324a constituting a part of the gate electrode, and the high concentration impurity region 333 functioning as the source or drain region. The p-channel TFT 502 has a channel forming region 373, the impurity region 343 that does not overlap the first conductive layer 340a constituting a part of the gate electrode, and the impurity regions 350 and 353 functioning as the source or drain region.

The switching TFT 503 of the pixel portion 507 has a channel forming portion 374, the low concentration impurity region 344 (LDD region), which does not overlap the first conductive layer 341*a* forming the gate electrode and which is formed outside the gate electrode, and the high concentration impurity region 336 functioning as the source or drain region.

The current control TFT 504 of the pixel portion 507 has a channel forming region 375, and the high concentration impurity regions 352 and 355 functioning as the source or drain region. Further, the capacitor 505 is formed such that the first conductive layer 326*a* and the second conductive layer 326*b* function as one of the electrodes.

Note that, in this embodiment, although a structure in which the cathode is formed after the EL layer is formed on the pixel electrode (anode), a structure in which the EL layer and the anode are formed on the pixel electrode (cathode) may be adopted. Incidentally, in this case, different from the outgoing from a lower surface described above, the outgoing from an upper surface is adopted. Furthermore, at this time, it is desirable that each of the switching TFT and the current control TFT is formed of the n-channel TFT having the low concentration impurity region (LDD region) described in this embodiment.

Embodiment 2

In this embodiment, a method of completing the EL module (FIG. 5) manufactured in Embodiment 1 as a light emitting device is described with reference to FIGS. 6A and 6B.

Figure 6A:
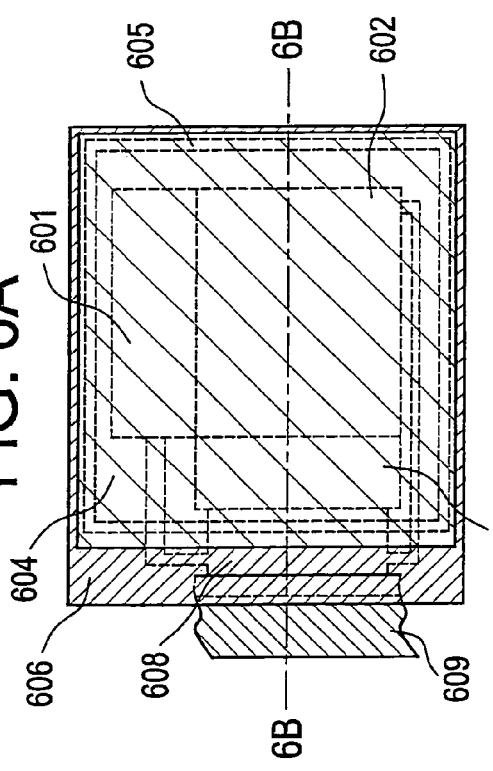
FIGS. 6A and 6B show a sealing structure of the light emitting device of the present invention.
Figure 6B:
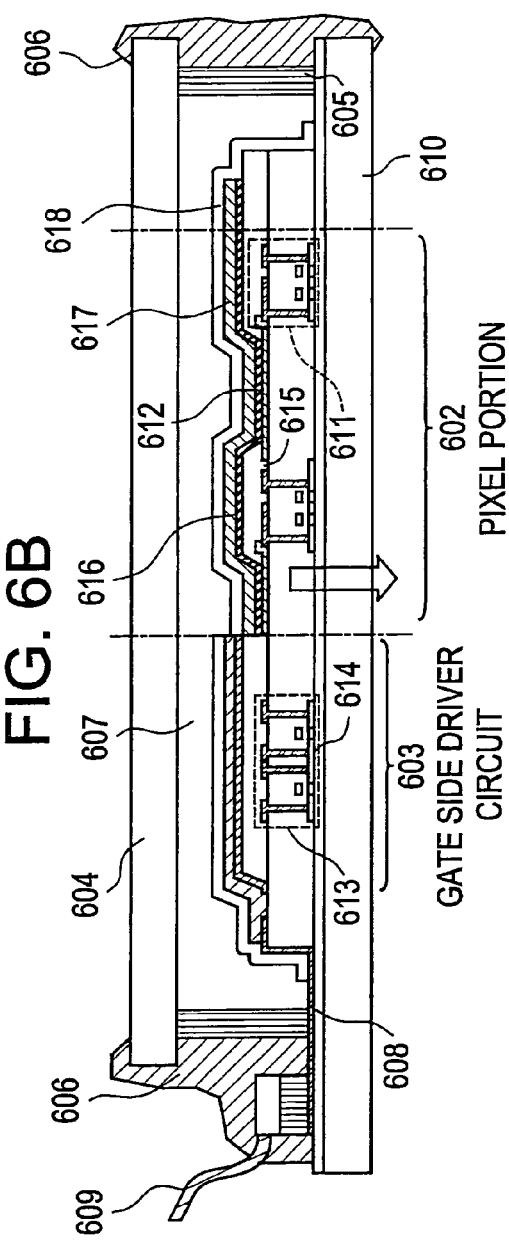

FIG. 6A is a top surface diagram showing a state completed up through sealing of an EL element. FIG. 6B is a cross sectional view taken along a line A–A' of FIG. 6A. Reference numeral 601 indicated by a dotted line indicates a source side driver circuit, reference numeral 602 indicates a pixel portion, and reference numeral 603 indicates a gate side driver circuit. Further, reference numeral 604 indicates a cover member, reference numeral 605 indicates a first sealant, and reference numeral 606 indicates a second sealant. The inside surrounded by the first sealant 605 is a space.

Note that reference numeral 608 indicates a wiring for transmitting a signal input to the source side driver circuit 601 and the gate side driver circuit 603, and the wiring receives a video signal or a clock signal from an FPC (flexible printed circuit) 609 as an external input terminal. Although only the FPC is shown in the figure, the FPC may be attached with a print wiring board (PWB). The light emitting device in this specification includes not only the light emitting device itself but also the light emitting device attached with the FPC or PWB.

Next, the cross sectional structure is explained with reference to FIG. 6B. The pixel portion 602 and the gate side driver circuit 603 are formed above a substrate 610, and the pixel portion 602 is formed of a plurality of pixels each including a current control TFT 611 and a transparent electrode 612 electrically connected with the drain. Further, the gate side driver circuit 603 is formed by using a CMOS circuit (see FIG. 5) in which an n-channel TFT 613 and a p-channel TFT 614 are combined.

A transparent electrode 612 functions as an anode of the EL element. Further, a bank 615 is formed at each end of the transparent electrode 612, and an EL layer 616 and a cathode 617 of the EL element are formed on the transparent electrode 612.

The cathode 617 also functions as a common wiring to all the pixels, and is electrically connected with the FPC 609 through the connection wiring 608. Further, all the elements included in the pixel portion 602 and the gate side driver circuit 603 are covered with the cathode 617 and a passivation film 618.

Moreover, the cover member 604 is bonded by the first sealant 605. Note that a spacer made of a resin film may be provided in order to secure the interval between the cover member 604 and the EL element. A space 607 inside the first sealant 605 is filled with an inert gas such as nitrogen. Note that an epoxy-based resin is preferably used as the first sealant 605. Besides, it is desirable that the first sealant 605 is a material that does not permeated with moisture or oxygen as much as possible. Further, a substance with a moisture absorbing effect or a substance with an effect of preventing oxidization may be included in the space 607.

Furthermore, in this embodiment, FRP (fiberglass-reinforced plastics), PVF (polyvinyl fluoride), mylar, polyester, or acrylic may be used as a material for a plastic substrate constituting the cover member 604.

In addition, after the cover member 604 is bonded using the first sealant 605, the second sealant 606 is provided so as to cover the side surface (exposing surface). Note that the same material as for the first sealant 605 may be used for the second sealant 606.

The EL element is sealed into the space 607 with the above structure, whereby the EL element can be shut out from the outside. Thus, a substance that promotes deterioration of the EL layer due to oxidization, such as moisture or oxygen can be prevented from permeating from the outside. Therefore, the light emitting device with high reliability can be obtained.

Note that the structure of this embodiment can be implemented by freely combining it with any structure of Embodiment 1.

Embodiment 3

Figure 7A:
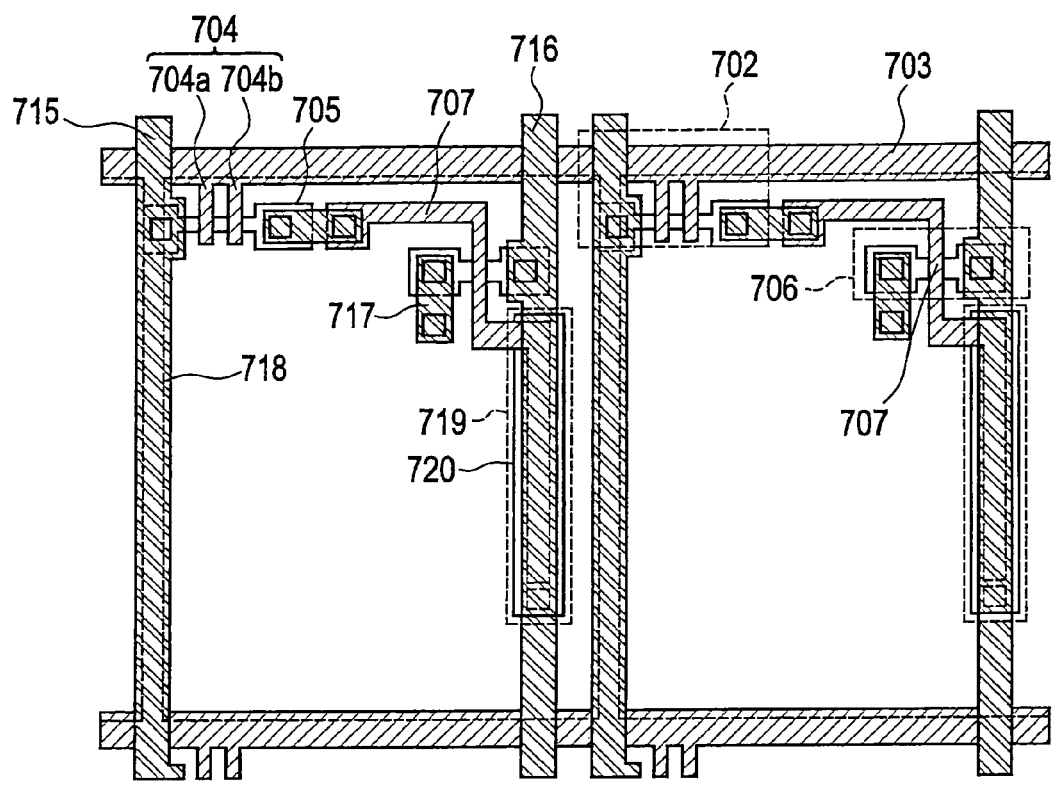
FIGS. 7A and 7B are a top structural diagram and a circuit diagram of a pixel portion of the light emitting device of the present invention, respectively.
Figure 7B:
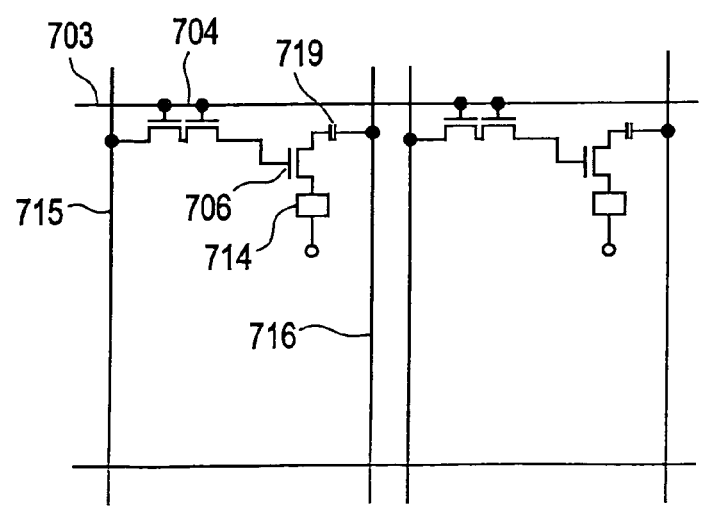

A detailed top surface structure of a pixel portion is shown in FIG. 7A, and a circuit diagram thereof is shown in FIG. 7B. In FIGS. 7A and 7B, a switching TFT 704 provided on a substrate is formed by using the switching TFT (n-channel type) TFT 503 of FIG. 5. Therefore, an explanation of the switching (n-channel type) TFT 503 may be referred for an explanation of the structure. Further, a wiring indicated by reference numeral 703 is a gate wiring for electrically connecting with gate electrodes 704*a* and 704*b* of the switching TFT 704.

Note that, in this embodiment, a double gate structure is adopted, in which two channel forming regions are formed, but a single gate structure, in which one channel forming region is formed, or a triple gate structure, in which three channel forming regions are formed, may also be adopted.

Further, a source of the switching TFT 704 is connected to a source wiring 715, and a drain thereof is connected to a drain wiring 705. The drain wiring 705 is electrically connected with a gate electrode 707 of a current control TFT 706. Note that the current control TFT 706 is formed by using the current control (p-channel type) TFT 504 of FIG. 5. Therefore, an explanation of the current control (p-channel type) TFT 504 may be referred for an explanation of the structure. Note that, although the single gate structure is adopted in this embodiment, the double gate structure or the triple gate structure may also be adopted.

Further, a source of the current control TFT 706 is electrically connected with a current supply line 716, and a drain thereof is electrically connected with a drain wiring 717. Besides, the drain wiring 717 is electrically connected with a pixel electrode (anode) 718 indicated by a dotted line.

At this time, a storage capacitor (condenser) is formed in a region indicated by reference numeral 719. The capacitor 719 is formed by a semiconductor film 720 electrically connected with the current supply line 716, an insulating film (not shown) of the same layer as a gate insulating film, and the gate electrode 707. Further, a capacitor formed by the gate electrode 707, the same layer (not shown) as a first interlayer insulating film, and the current supply line 716 may be used as a storage capacitor.

Note that the structure of this embodiment can be implemented by freely combining it with any structure of Embodiment 1 and Embodiment 2.

Embodiment 4

Figure 8A:
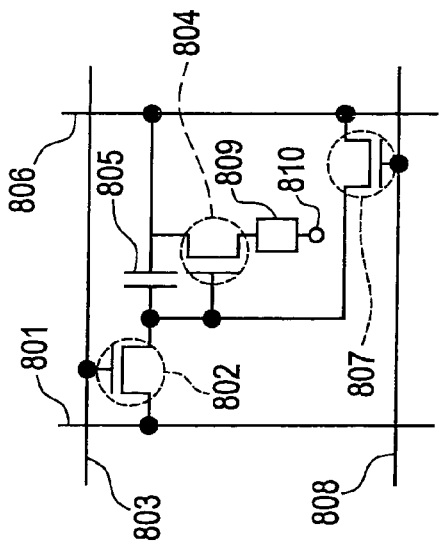
FIGS. 8A and 8B are a circuit diagram and a cross sectional view of a pixel portion of a light emitting device of the present invention, respectively.
Figure 8B:
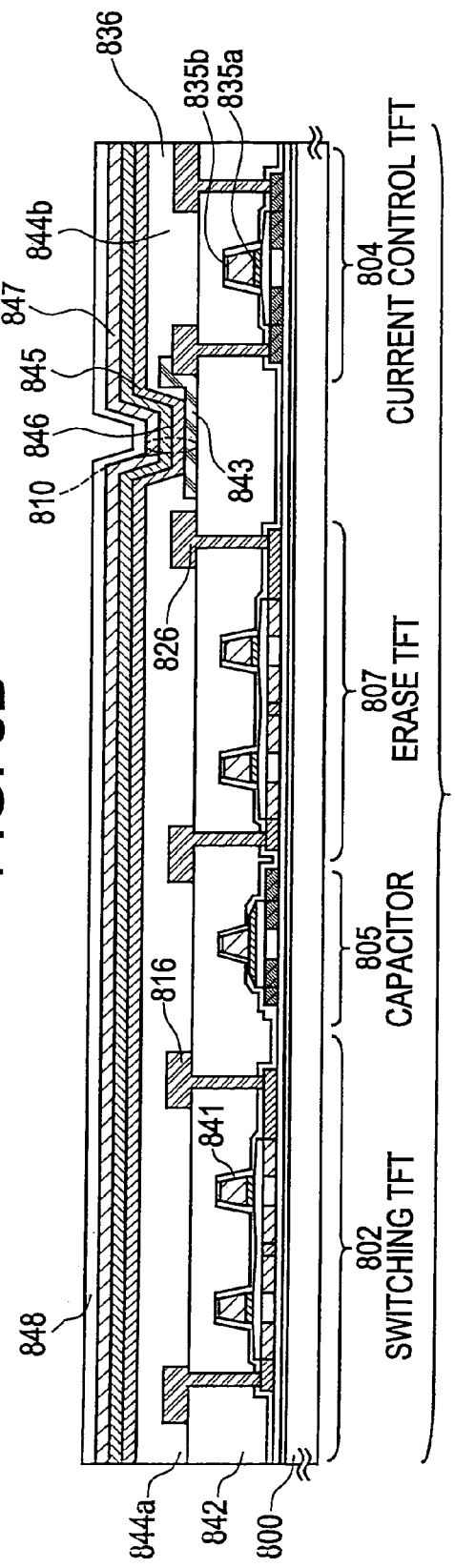

In this embodiment, with respect to a pixel portion of a light emitting device having a structure different from that shown in Embodiment 1, the circuit diagram is shown in FIG. 8A, and the cross sectional structure is shown in FIG. 8B.

First, in FIG. 8A, reference numeral 801 indicates a source signal line connected with a source of a switching TFT 802, and reference numeral 803 indicates a write gate signal line connected with a gate of the switching TFT 802. Further, reference numeral 804 indicates a current control TFT, and 805 indicates a capacitor (this may be omitted). Reference numeral 806 indicates a current supply line, and reference numeral 807 indicates an erase TFT, which is connected with an erase gate signal line 808. Note that reference numeral 809 indicates an EL element, and reference numeral 810 indicates an opposing power source. Japanese Patent Application No. Hei 11-338786 may be referred for an operation of the erase TFT 807.

A drain of the erase TFT 807 is connected with a gate electrode of the current control TFT 804, and a gate voltage of the current control TFT 804 can be forcedly changed. Note that the erase TFT 807 may be either an n-channel TFT or a p-channel TFT, but preferably has the same structure as the switching TFT 802 so as to make an off current small.

Next, the cross sectional structure is explained. In FIG. 8B, the switching TFT 802 provided on a substrate 800 uses the n-channel TFT formed using a known method. In this embodiment, the double gate structure is adopted. The double gate structure substantially corresponds to a structure in which two TFTs are connected in series, and thus, there is an advantage that an off current value can be reduced. Further, the p-channel TFT formed using a known method may also be used.

The erase TFT 807 uses the n-channel TFT formed using a known method. The p-channel TFT formed using a known method may also be used. Note that a drain wiring 826 of the erase TFT 807 is electrically connected with a drain wiring 816 of the switching TFT 802 and a gate electrode 835 (835a, 835b) of the current control TFT by another wiring.

Further, in this embodiment, both the switching TFT 802 and the erase TFT 807 are formed such that the gate electrode does not overlap a low concentration impurity region through a gate insulating film. That is, an LDD region is formed.

Moreover, the current control TFT 804 uses the p-channel TFT formed using a known method. The gate electrode 835 (835a, 835b) of the current control TFT is electrically connected with the drain wiring 816 of the switching TFT 802 and the drain wiring 826 of the erase TFT 807 by another wiring.

Note that the current control TFT 804 is formed such that the gate electrode does not overlap the source and drain regions through the gate insulating film.

Further, in this embodiment, the current control TFT 804 with the single gate structure is shown in the figure, but a multi-gate structure in which a plurality of TFTs are connected in series may be adopted. Furthermore, a structure may be adopted, in which a plurality of TFTs are connected in parallel to substantially divide a channel forming region into the plural and heat radiation is performed with high efficiency. This structure is effective as a countermeasure for deterioration due to heat.

In addition, a drain wiring 836 is connected with the current supply line 806 and always applied with a constant voltage.

A first passivation film 841 is provided on the switching TFT 802, the current control TFT 804, and the erase TFT 807, and an interlayer insulating film 842 formed of a resin insulating film is formed thereon. It is very important that the step formed by the TFT is leveled using the interlayer insulating film 842. Since an EL layer formed later is very thin, the existence of the step may cause emission defect. Therefore, leveling is desirably performed before the formation of a pixel electrode in order to form the EL layer on the level surface as long as possible.

Further, a transparent conductive film is used as a pixel electrode (anode) 843. Specifically, a conductive film formed from a compound of indium oxide and zinc oxide is used. Of course, a conductive film formed from a compound of indium oxide and tin oxide may also be used. Note that the pixel electrode (anode) 843 is electrically connected with a drain region of the current control TFT 804.

Furthermore, an EL layer 845 is formed in a channel (corresponding to a pixel) constituted of banks 844a and 844b formed of an insulating film (preferably resin). Note that although only one pixel is shown in the figure, EL layers corresponding to respective colors of R (red), G (green), and B (blue) may be formed. As an organic EL material for forming the EL layer, a π conjugated polymer material is used. polyparaphenylene vinylene (PPV), polyvinylcarbazole (PVK), polyfluorene, and the like can be given as typical polymer materials.

Note that there are various types of the PPV organic EL material. For example, materials described in 'H. Shenk, H. Becker, O. Gelsen, E. Kluge, W. Kreuder, and H. Spreitzer, "Polymers for Light Emitting Diodes", Euro-Display, Proceedings, 1999, p. 33 to 37' or Japanese Patent Application Laid-open No. Hei 10-92576 may be used.

Note also that, in this embodiment, it is appropriate that cyanopolyphenylene vinylene is used for a red color light emitting layer, that polyphenylene vinylene is used for a green color light emitting layer, and that polyphenylene vinylene or polyalkyl phenylene is used for a blue color light emitting layer. The thickness is appropriately 30 to 150 nm (preferably 40 to 100 nm).

Incidentally, the above is one example of the organic EL material that can be used for the light emitting layer forming the EL layer, and the present invention is not necessarily limited to this. In the present invention, it is appropriate that the EL layer (layer for light emission and movement of carriers for light emission) is formed by freely combining the respective layers made from materials having different functions such as a hole injecting layer, a hole transporting layer, a light emitting layer, an electron transporting layer, an electron injecting layer, a hole inhibiting layer, and a buffer layer.

In this embodiment, an example of using the polymer material for the light emitting layer is shown, for example, but a low molecular weight organic EL material may also be used. Further, an inorganic material such as silicon carbide may be used for a charge transporting layer or a charge injecting layer. Known materials may be used as the organic EL material or the inorganic material.

A cathode 846 is formed on the EL layer 845. Note that the cathode 846 is formed from MgAg.

At the time when the formation of the cathode 846 is completed, the EL element 810 is completed. Note that the EL element 810 here indicates the element constituted of the pixel electrode (anode) 843, the light emitting layer 845, and the cathode 846.

Further, in this embodiment, a protective electrode 847 made from aluminum is formed on the cathode 846, and a passivation film 848 is provided thereon. A silicon nitride film or a silicon oxide nitride film is preferably used as the passivation film 848. The purpose of the above provision is to shut out the EL element from the outside, which provides both a function of preventing deterioration of the organic EL material due to oxidization and a function of suppressing degassing from the organic EL material. Thus, the reliability of the light emitting device is increased.

As described above, the light emitting device of the present invention has the structure shown in FIGS. 8A and 8B, and has the switching TFT with a sufficiently low off current value and the current control TFT resistant to hot carrier injection. Therefore, the light emitting device with high reliability, which enables a satisfactory image display can be obtained. Note that, in this embodiment, only the structure of the pixel portion is described, and a driver circuit has the same structure shown in Embodiment 1.

Note that the structure of this embodiment can be implemented by freely combining it with any structure of Embodiment 1 to Embodiment 3.

Embodiment 5

Figure 9A:
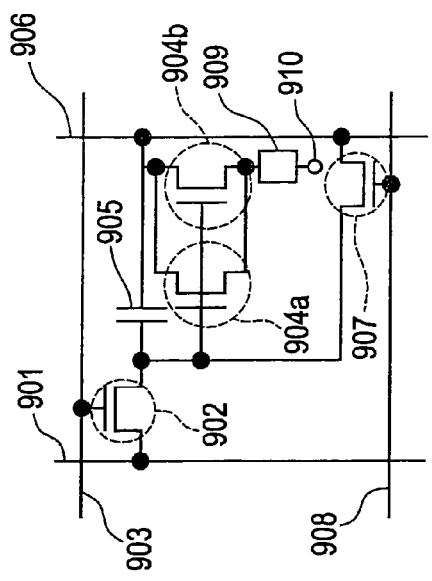
FIGS. 9A and 9B are a circuit diagram and a cross sectional view of a pixel portion of a light emitting device of the present invention, respectively.
Figure 9B:
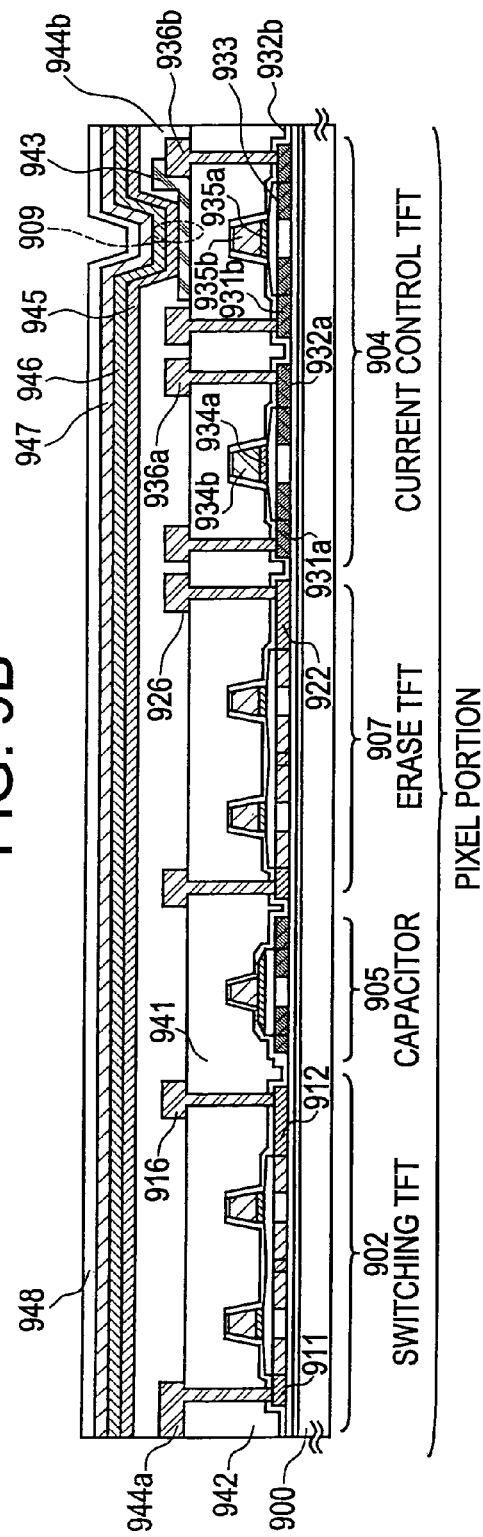
Figure 10A:
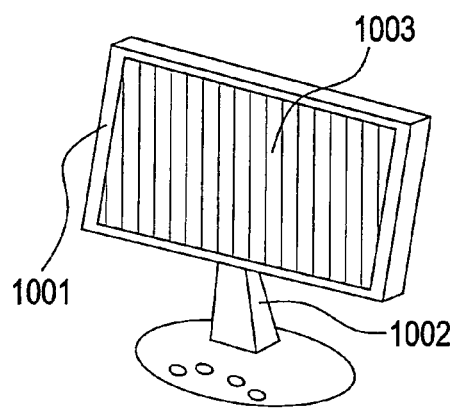
FIGS. 10A to 10F are diagrams showing specific examples of electric equipment using the light emitting device of the present invention.
Figure 10B:
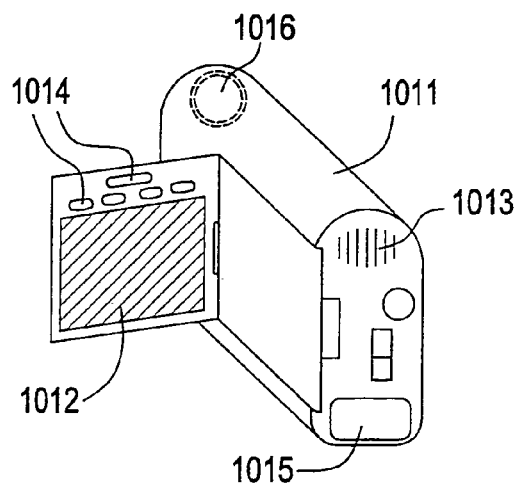
Figure 10C:
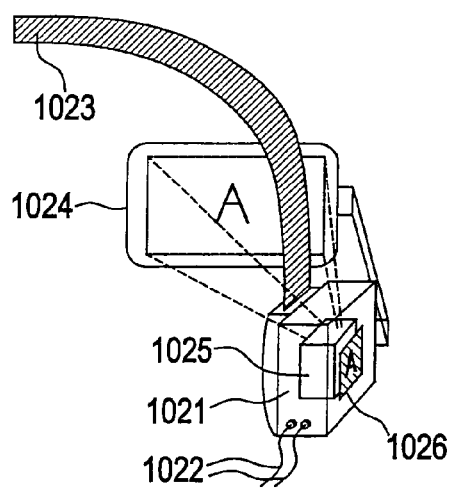
Figure 10D:
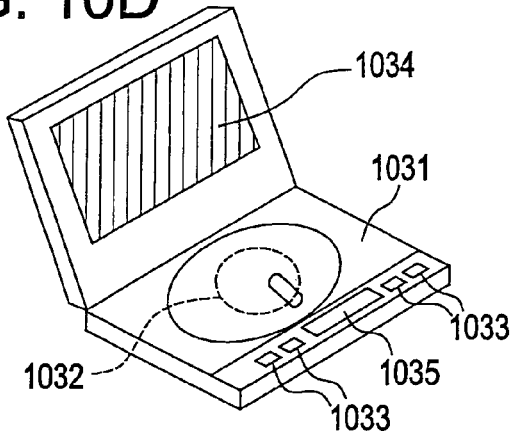
Figure 10E:
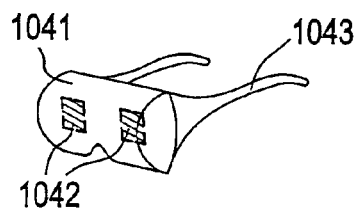
Figure 10F:
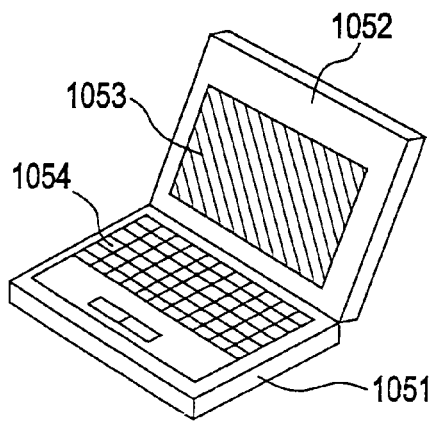
Figure 11A:
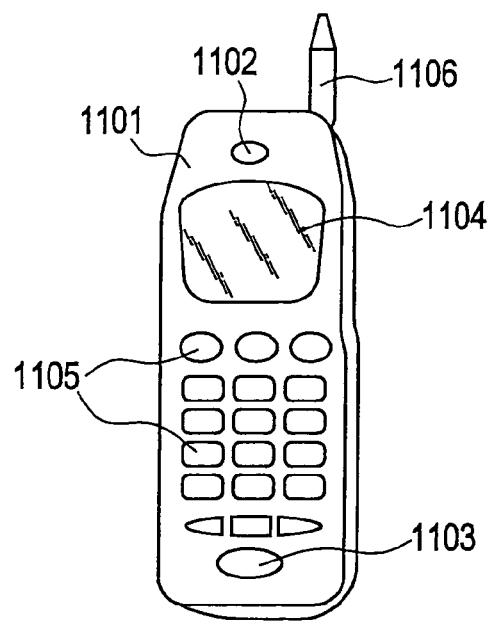
FIGS. 11A to 11C are diagrams showing specific examples of electric equipment using the light emitting device of the present invention.
Figure 11B:
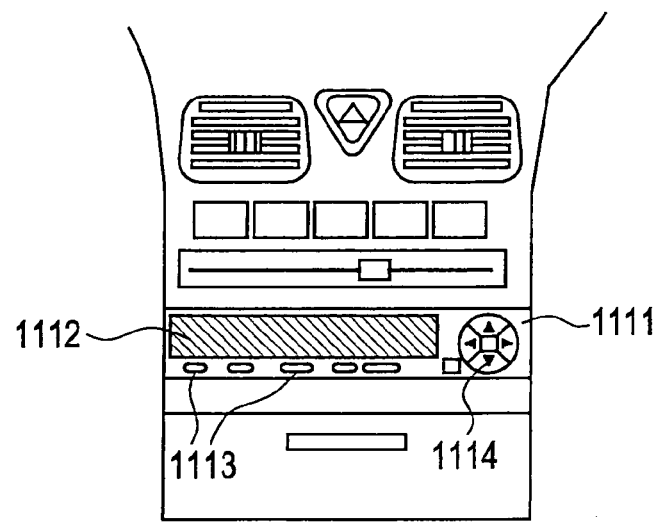
Figure 11C:
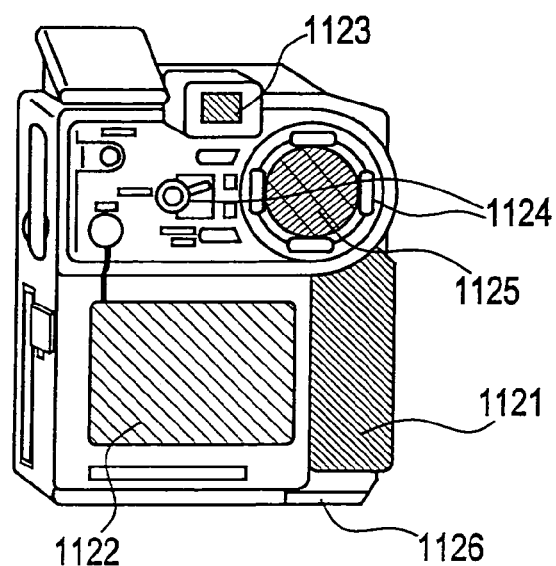

Next, a circuit diagram of a pixel portion of a light emitting device in which the present invention is implemented with a structure different from that in Embodiment 4 is shown in FIG. 9A, and a cross sectional structure of the pixel portion is shown in FIG. 9B.

Note that Japanese Patent Application No. 2000-127384 may be referred for details of a driving method and the like.

In FIG. 9A, reference numeral 901 indicates a source signal line connected with a source of a switching TFT 902, and reference numeral 903 indicates a write gate signal line connected with a gate electrode of the switching TFT 902. Reference numeral 904 (904a, 904b) indicates a current control TFT, and reference numeral 905 indicates a capacitor (this may be omitted). Further, reference numeral 906 indicates a current supply line, and reference numeral 907 indicates an erase TFT that is connected with an erase gate signal line 908. Note that reference numeral 909 indicates an EL element, and reference numeral 910 indicates an opposing power source.

A drain of the erase TFT 907 is connected with a gate electrode of the current control TFT 904, and can forcedly change a gate voltage of the current control TFT 904. Note that the erase TFT 907 may be an n-channel TFT or a p-channel TFT, but preferably has the same structure as the switching TFT 902 so as to make an off current small.

Further, in this embodiment, as the current control TFT 904, the first current control TFT 904a and the second current control TFT 904b are provided in parallel. Thus, radiation of heat generated by a current flowing through an active layer of the current control TFT can be effectively performed, and deterioration of the current control TFT can be suppressed. Moreover, variation of a drain current generated due to variation of characteristics such as a threshold value and mobility of the current control TFT can be suppressed.

In this embodiment, the first current control TFT 904a and the second current control TFT 904b are used as the current control TFT, but this embodiment is not limited to this. In each pixel, the number of TFTs used as the current control TFTs may be two or more.

Further, the cross sectional view of the light emitting device in this embodiment is shown in FIG. 9B. FIG. 9B shows almost the same structure as shown in Embodiment 3, and thus, the explanation is omitted. The feature is that there are two current control TFTs provided in parallel as described in the explanation of FIG. 9A, and this feature is explained.

In FIG. 9B, the current control TFT 904 has the first current control TFT 904a and the second current control TFT 904b. Note that a drain 932a of the first current control TFT 904a is electrically connected with a pixel electrode 943 of the EL element 909 through a drain wiring 936a. Further, a drain 932b of the second current control TFT 904b is similarly connected with the pixel electrode 943 of the EL element 909 through a drain wiring 936b. Note that each of the first current control TFT 904a and the second current control TFT 904b is formed such that the gate electrode does not overlap a source region and a drain region through a gate insulating film.

Furthermore, a gate electrode 934 (934a, 934b) of the first current control TFT 904a and a gate electrode 935 (935a, 935b) of the second current control TFT 904b are electrically connected with a drain 912 of the switching TFT 902 through a drain wiring 916. Note that the gate electrodes are electrically connected with a drain 922 of the erase TFT 907 through a drain wiring 926.

Note that, in this embodiment, each of the switching TFT 902 and the erase TFT 907 is formed such that a gate electrode does not overlap a low concentration impurity region through a gate insulating film.

Note that only the structure of the pixel portion is explained in this embodiment, and a driver circuit has the same structure as shown in Embodiment 1.

In addition, the structure of this embodiment can be implemented by freely combining it with any structure in Embodiment 1 to Embodiment 4.

Embodiment 6

In driving a light emitting device of the present invention, both an analog drive using an analog signal as an image signal and a digital drive using a digital signal may be conducted.

In case of the analog drive, an analog signal is sent to a source wiring of a switching TFT, and the analog signal including gray scale information becomes a gate voltage of a current control TFT. The current control TFT controls a current flowing through an EL element, and controls emission strength of the EL element to perform a gray scale display. Note that it is appropriate that the current control TFT is operated in a saturation region in the analog drive.

On the other hand, in case of the digital drive, different from an analog gray-scale display, a gray scale display called a time-division drive is performed. That is, visible change of color gray scale can be seen by regulating the length of emission time. Note that it is appropriate that the current control TFT is operated in a linear region in the digital drive.

The EL element has a response speed extremely faster than a liquid crystal element, and thus, can be driven at high speed. Therefore, it can be said that the EL element is an element suitable for the time-division drive in which a gray scale display is performed by dividing one frame into a plurality of sub-frames.

As described above, the present invention is a technique relating to an element structure, and therefore, any driving method may be adopted.

Note that the structure of this embodiment can be implemented by freely combining it with any structure of Embodiment 1 to Embodiment 5.

Embodiment 7

The light-emitting display device of the present invention, is a self light emitting type, therefore compared to a liquid crystal display device, it has excellent visible properties and is broad in an angle of visibility. Accordingly, the light-emitting display device can be applied to a display portion in various electronic devices. For example, in order to view a TV program or the like on a large-sized screen, the light-emitting display device in accordance with the present invention can be used as a display portion of a light-emitting display having a diagonal size of 30 inches or larger (typically 40 inches or larger).

The display includes all kinds of displays to be used for displaying information, such as a display for a personal computer, a display for receiving a TV broadcasting program, a display for advertisement display. Moreover, the light-emitting device in accordance with the present invention can be used as a display portion of other various electric devices.

As other electronic equipments of the present invention there are: a video camera; a digital camera; a goggle type display (head mounted display); a navigation system; a sound reproduction device (a car audio stereo and an audio set and so forth); a notebook type personal computer; a game apparatus; a portable information terminal (such as a mobile computer, a portable telephone, a portable game machine, or an electronic book); and an image playback device equipped with a recording medium (specifically, device provided with a display portion which plays back images in a recording medium such as a digital versatile disk player (DVD), and displays the images). Specific examples of those electronic equipments are shown in FIGS. 10A to 11C.

According to the present invention, in the driver circuit and the pixel portion of the light emitting device, the TFTs having different structures in the gate electrode and in the low concentration impurity region can be manufactured. Thus, problems such as the improvement of the off current and the countermeasure for hot carrier, which are expected in the TFT of the driver circuit, and the reduction of the off current, which is expected in the TFT of the pixel portion can be solved all together. Further, the problem from the viewpoint of the process can be solved, which is caused at the time of manufacturing the p-channel TFT in the pixel portion.

The invention claimed is:

1. A light emitting device comprising:
a switching TFT provided over a substrate;
an erase TFT provided over the substrate;
a current control TFT provided over the substrate;
an EL element provided over the substrate; and
an n-channel driver TFT provided in a driver circuit and over the substrate,
wherein impurity regions of the switching TFT and the erase TFT are electrically connected with a gate electrode of the current control TFT,
wherein an impurity region of the current control TFT is electrically connected with the EL element,
wherein gate electrodes of the switching TFT and the erase TFT exist at respective positions where the gate electrodes do not overlap the impurity regions of the switching TFT and the erase TFT, respectively, through a gate insulating film,
wherein a gate electrode of the n-channel driver TFT overlaps a low concentration impurity region of the n-channel driver TFT,
wherein the gate electrode of the switching TFT comprises a first conductive layer and a second conductive layer provided over the first conductive layer,
wherein a side edge of the second conductive layer is aligned with a side edge of the first conductive layer,
wherein the gate electrode of the erase TFT comprises a third conductive layer and a fourth conductive layer provided over the third conductive layer, and
wherein a side edge of the fourth conductive layer is aligned with a side edge of the third conductive layer.

2. A device according to claim 1, wherein the gate electrode of the switching TFT exists at a position where the gate electrode overlaps a low concentration impurity region of the switching TFT through the gate insulating film.

3. A device according to claim 1, wherein the current control TFT is a p-channel type.

4. A device according to claim 1, wherein the switching TFT is an n-channel type.

5. A device according to claim 1, wherein a driver circuit formed on the substrate is constituted of an n-channel TFT and a p-channel TFT, and a gate electrode of the n-channel TFT exists at a position where the gate electrode overlaps a low concentration impurity region of the n-channel TFT.

6. Electric equipment using the light emitting device according to claim 1.

7. A device according to claim 1, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

8. A device according to claim 1, wherein a plurality of the current control TFTs are included in a pixel.

9. A light emitting device comprising:
an n-channel switching TFT provided over a substrate;
an n-channel erase TFT provided over the substrate;
a current control TFT provided over the substrate;
an EL element provided over the substrate; and
an n-channel driver TFT provided in a driver circuit and over the substrate,
wherein a gate electrode of the n-channel switching TFT does not overlap an impurity region of the n-channel switching TFT,
wherein a gate electrode of the n-channel erase TFT does not overlap an impurity region of the n-channel erase TFT,
wherein a gate electrode of the n-channel driver TFT overlaps a low concentration impurity region of the n-channel driver TFT,
wherein the gate electrode of the n-channel switching TFT comprises a first conductive layer and a second conductive layer provided over the first conductive layer,
wherein a side edge of the second conductive layer is aligned with a side edge of the first conductive layer, wherein the gate electrode of the n-channel erase TFT comprises a third conductive layer and a fourth conductive layer provided over the third conductive layer, and wherein a side edge of the fourth conductive layer is aligned with a side edge of the third conductive layer.

10. A device according to claim 9 wherein the EL element comprises an anode, a light emitting layer and a cathode, the light emitting layer provided between the anode and the cathode.

11. A device according to claim 10 wherein the anode comprises a transparent conductive film.

12. A device according to claim 9, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

13. A device according to claim 9 wherein the n-channel driver TFT comprises a source region and a drain region which are provided outside the gate electrode of the n-channel driver TFT.

14. A device according to claim 9 wherein the gate electrode of the n-channel switching TFT has a tapered shape.

15. A device according to claim 9 wherein the gate electrode of the n-channel erase TFT has a tapered shape.

16. A device according to claim 9 wherein the gate electrode of the n-channel driver TFT has a tapered shape.

17. A light emitting device comprising:
a switching TFT provided over a substrate;
an erase TFT provided over the substrate;
a current control TFT provided over the substrate;
an EL element provided over the substrate; and
an n-channel driver TFT provided in a driver circuit and over the substrate,
wherein a gate electrode of the switching TFT does not overlap an impurity region of the switching TFT,
wherein a gate electrode of the erase TFT does not overlap an impurity region of the erase TFT,
wherein a gate electrode of the n-channel driver TFT comprises a first conductive layer and a second conductive layer provided over the first conductive layer, and the first conductive layer of the gate electrode of the n-channel driver TFT overlaps a low concentration impurity region of the n-channel driver TFT,
wherein the gate electrode of the switching TFT comprises a third conductive layer and a fourth conductive layer provided over the third conductive layer,
wherein a side edge of the fourth conductive layer is aligned with a side edge of the third conductive layer,
wherein the gate electrode of the erase TFT comprises a fifth conductive layer and a sixth conductive layer provided over the fifth conductive layer, and
wherein a side edge of the sixth conductive layer is aligned with a side edge of the fifth conductive layer.

18. A device according to claim 17 wherein the EL element comprises an anode, a light emitting layer and a cathode, the light emitting layer provided between the anode and the cathode.

19. A device according to claim 18 wherein the anode comprises a transparent conductive film.

20. A device according to claim 17, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

21. A device according to claim 17 wherein the n-channel driver TFT comprises a source region and a drain region which are provided outside the gate electrode of the n-channel driver TFT.

22. A device according to claim 17 wherein the gate electrode of the switching TFT has a tapered shape.

23. A device according to claim 17 wherein the gate electrode of the erase TFT has a tapered shape.

24. A device according to claim 17 wherein the first conductive layer of the gate electrode of the n-channel driver TFT has a tapered shape.

25. A device according to claim 17 wherein the second conductive layer of the gate electrode of the n-channel driver TFT has a tapered shape.

26. A light emitting device comprising:
a switching TFT provided over a substrate;
an erase TFT provided over the substrate;
a current control TFT provided over the substrate;
an EL element provided over the substrate; and
an n-channel driver TFT provided in a driver circuit and over the substrate,
wherein impurity regions of the switching TFT and the erase TFT are electrically connected with a gate electrode of the current control TFT,
wherein an impurity region of the current control TFT is electrically connected with the EL element,
wherein gate electrodes of the switching TFT and the erase TFT exist at respective positions where the gate electrodes do not overlap the impurity regions of the switching TFT and the erase TFT, respectively, through a gate insulating film,
wherein a gate electrode of the n-channel driver TFT overlaps a low concentration impurity region of the n-channel driver TFT,
wherein the gate electrode of the switching TFT comprises a first conductive layer and a second conductive layer provided over the first conductive layer,
wherein the second conductive layer overlaps the first conductive layer up to a side edge of the first conductive layer,
wherein the gate electrode of the erase TFT comprises a third conductive layer and a fourth conductive layer provided over the third conductive layer, and
wherein the fourth conductive layer overlaps the third conductive layer up to a side edge of the third conductive layer.

27. A device according to claim 26, wherein the gate electrode of the switching TFT exists at a position where the gate electrode overlaps a low concentration impurity region of the switching TFT through the gate insulating film.

28. A device according to claim 26, wherein the current control TFT is a p-channel type.

29. A device according to claim 26, wherein the switching TFT is an n-channel type.

30. A device according to claim 26, wherein the driver circuit further comprises a p-channel TFT.

31. Electric equipment using the light emitting device according to claim 26.

32. A device according to claim 26, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

33. A device according to claim 26, wherein a plurality of the current control TFTs are included in a pixel.

34. A light emitting device comprising:
a switching TFT provided over a substrate;
an erase TFT provided over the substrate;
a current control TFT provided over the substrate;
an EL element provided over the substrate; and
an n-channel driver TFT provided in a driver circuit and over the substrate,
wherein a gate electrode of the switching TFT does not overlap an impurity region of the switching TFT,
wherein a gate electrode of the erase TFT does not overlap an impurity region of the erase TFT,
wherein a gate electrode of the n-channel driver TFT comprises a first conductive layer and a second conductive layer provided over the first conductive layer, and the first conductive layer of the gate electrode of the n-channel driver TFT overlaps a low concentration impurity region of the n-channel driver TFT,
wherein the gate electrode of the switching TFT comprises a third conductive layer and a fourth conductive layer provided over the third conductive layer,
wherein the fourth conductive layer overlaps the third conductive layer up to a side edge of the third conductive layer,
wherein the gate electrode of the erase TFT comprises a fifth conductive layer and a sixth conductive layer provided over the fifth conductive layer, and
wherein the sixth conductive layer overlaps the fifth conductive layer up to a side edge of the fifth conductive layer.

35. A device according to claim 34 wherein the EL element comprises an anode, a light emitting layer and a cathode, the light emitting layer provided between the anode and the cathode.

36. A device according to claim 35 wherein the anode comprises a transparent conductive film.

37. A device according to claim 34, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

38. A device according to claim 34 wherein the n-channel driver TFT comprises a source region and a drain region which are provided outside the gate electrode of the n-channel driver TFT.

39. A device according to claim 34 wherein the gate electrode of the switching TFT has a tapered shape.

40. A device according to claim 34 wherein the gate electrode of the erase TFT has a tapered shape.

41. A device according to claim 34 wherein the first conductive layer of the gate electrode of the n-channel driver TFT has a tapered shape.

42. A device according to claim 34 wherein the second conductive layer of the gate electrode of the n-channel driver TFT has a tapered shape.

43. A light emitting device comprising:
a switching TFT comprising a source region and a drain region and a low concentration impurity region and a gate insulating film and a gate electrode wherein the source region and the drain region and the low concentration impurity region are provided in a semiconductor film provided over a substrate and wherein the low concentration impurity region is provided between the source region and the drain region;
an erase TFT provided over the substrate;
a current control TFT provided over the substrate;
an EL element provided over the substrate; and
an n-channel driver TFT provided in a driver circuit and over the substrate,
wherein the gate electrode of the switching TFT does not overlap the low concentration impurity region of the switching TFT,
wherein a gate electrode of the erase TFT does not overlap an impurity region of the erase TFT,
wherein a gate electrode of the n-channel driver TFT overlaps a low concentration impurity region of the n-channel driver TFT,
wherein the gate insulating film of the switching TFT is provided and tapered over the low concentration impurity region of the switching TFT, and
wherein at least one of the source region and the drain region of the switching TFT is provided outside the gate insulating film of the switching TFT.

44. A device according to claim 43 wherein the EL element comprises an anode, a light emitting layer and a cathode, the light emitting layer provided between the anode and the cathode.

45. A device according to claim 44 wherein the anode comprises a transparent conductive film.

46. A device according to claim 43, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

47. A device according to claim 43 wherein the n-channel driver TFT comprises a source region and a drain region which are provided outside the gate electrode of the n-channel driver TFT.

48. A device according to claim 43 wherein the gate electrode of the switching TFT has a tapered shape.

49. A device according to claim 43 wherein the gate electrode of the erase TFT has a tapered shape.

50. A device according to claim 43 wherein the gate electrode of the n-channel driver TFT has a tapered shape.

51. A light emitting device comprising:
a switching TFT comprising a source region and a drain region and a low concentration impurity region and a gate insulating film and a gate electrode wherein the source region and the drain region and the low concentration impurity region are provided in a semiconductor film provided over a substrate and wherein the low concentration impurity region is provided between the source region and the drain region;
an erase TFT provided over the substrate;
a current control TFT provided over the substrate;
an EL element provided over the substrate; and
an n-channel driver TFT provided in a driver circuit and over the substrate,
wherein the gate electrode of the switching TFT does not overlap the low concentration impurity region of the switching TFT,
wherein a gate electrode of the erase TFT does not overlap an impurity region of the erase TFT,
wherein the gate insulating film of the switching TFT is provided and tapered over the low concentration impurity region of the switching TFT, wherein at least one of the source region and the drain region of the switching TFT is provided outside the gate insulating film of the switching TFT, and wherein a gate electrode of the n-channel driver TFT comprises a first conductive layer and a second conductive layer provided over the first conductive layer, and the first conductive layer of the gate electrode of the n-channel driver TFT overlaps a low concentration impurity region of the n-channel driver TFT.

52. A device according to claim 51 wherein the EL element comprises an anode, a light emitting layer and a cathode, the light emitting layer provided between the anode and the cathode.

53. A device according to claim 52 wherein the anode comprises a transparent conductive film.

54. A device according to claim 51, wherein the light emitting device is one selected from the group consisting of a display device, a video camera, a head mounted display, a portable image playback device equipped with a recording medium, a goggle type display device, a personal computer, a portable telephone, a sound playback device, and a digital camera.

55. A device according to claim 51 wherein the n-channel driver TFT comprises a source region and a drain region which are provided outside the gate electrode of the n-channel driver TFT.

56. A device according to claim 51 wherein the gate electrode of the switching TFT has a tapered shape.

57. A device according to claim 51 wherein the gate electrode of the erase TFT has a tapered shape.

58. A device according to claim 51 wherein the gate electrode of the n-channel driver TFT has a tapered shape.

* * * * *